US008859888B2

(12) United States Patent
Smirnov et al.

(10) Patent No.: US 8,859,888 B2
(45) Date of Patent: Oct. 14, 2014

(54) SOLAR CELL WITH NANOSTRUCTURED LAYER AND METHODS OF MAKING AND USING

(75) Inventors: Valery K. Smirnov, Yaroslavl (RU); Dmitry S. Kibalov, Yaroslavl (RU)

(73) Assignee: Wostec, Inc., San Francisco, CA (US)

( * ) Notice: Subject to any disclaimer, the term of this patent is extended or adjusted under 35 U.S.C. 154(b) by 282 days.

(21) Appl. No.: 13/407,615

(22) Filed: Feb. 28, 2012

(65) Prior Publication Data

US 2013/0008497 A1    Jan. 10, 2013

Related U.S. Application Data

(63) Continuation of application No. PCT/RU2011/000631, filed on Aug. 19, 2011, and a continuation-in-part of application No. PCT/RU2011/000489, filed on Jul. 6, 2011.

(51) Int. Cl.
*H01L 31/0236* (2006.01)
*B82Y 30/00* (2011.01)
*H01L 31/0232* (2014.01)
*B82Y 20/00* (2011.01)

(52) U.S. Cl.
CPC ......... *H01L 31/02363* (2013.01); *B82Y 30/00* (2013.01); *H01L 31/02327* (2013.01); *B82Y 20/00* (2013.01); *Y02E 10/50* (2013.01)
USPC ...................................................... 136/256

(58) Field of Classification Search
CPC ................ H01L 31/00; H01L 31/0236; H01L 31/02363
USPC ..................................................... 136/243–265
See application file for complete search history.

(56) References Cited

U.S. PATENT DOCUMENTS

| 4,009,933 | A |   | 3/1977 | Firester |
| 4,072,541 | A | * | 2/1978 | Meulenberg et al. ......... 136/255 |
| 4,233,109 | A |   | 11/1980 | Nishizawa et al. |
| 4,400,409 | A |   | 8/1983 | Izu et al. |
| 4,857,080 | A |   | 8/1989 | Baker et al. |
| 5,160,618 | A |   | 11/1992 | Burggraaf et al. |

(Continued)

FOREIGN PATENT DOCUMENTS

| RU | 2152108 C1 | 6/2000 |
| RU | 2173003 C2 | 8/2001 |

(Continued)

OTHER PUBLICATIONS

Scott, K.L. et al., "Pattern Generators and Microcolumns for Ion Beam Lithography," Journal of Vacuum Science Technology B, 18(6) 2000, pp. 3172-3176.

(Continued)

*Primary Examiner* — Jonathan Johnson
*Assistant Examiner* — Christina Chern
(74) *Attorney, Agent, or Firm* — Lowe Graham Jones PLLC; Bruce E. Black

(57) ABSTRACT

A solar cell includes a base and a nanostructured layer formed on the base. The nanostructured layer has a nanostructured surface opposite the base. The nanostructured surface has a quasi-periodic, anisotropic array of elongated ridge elements having a wave-ordered structure pattern, each ridge element having a wavelike cross-section and oriented substantially in a first direction.

23 Claims, 23 Drawing Sheets

(56) References Cited

U.S. PATENT DOCUMENTS

| | | | |
|---|---|---|---|
| 5,498,278 | A | 3/1996 | Edlund |
| 5,530,272 | A | 6/1996 | Kudo et al. |
| 5,652,020 | A | 7/1997 | Collins et al. |
| 5,702,503 | A | 12/1997 | Tse Tang |
| 5,734,092 | A | 3/1998 | Wang et al. |
| 5,753,014 | A | 5/1998 | Van Rijn |
| 6,274,007 | B1 | 8/2001 | Smirnov et al. |
| 6,417,939 | B1 | 7/2002 | Laude |
| 6,452,724 | B1 | 9/2002 | Hansen et al. |
| 6,518,194 | B2 | 2/2003 | Winningham et al. |
| 6,580,172 | B2 | 6/2003 | Mancini et al. |
| 6,667,240 | B2 | 12/2003 | Ozaki et al. |
| 6,706,576 | B1 | 3/2004 | Ngo et al. |
| 6,810,899 | B2 | 11/2004 | Franz et al. |
| 6,954,275 | B2 | 10/2005 | Choi et al. |
| 7,001,446 | B2 | 2/2006 | Roark et al. |
| 7,175,694 | B2 | 2/2007 | Ma et al. |
| 7,265,374 | B2 | 9/2007 | Lee et al. |
| 7,338,275 | B2 | 3/2008 | Choi et al. |
| 7,604,690 | B2 | 10/2009 | Smirnov et al. |
| 7,768,018 | B2 | 8/2010 | Smirnov et al. |
| 7,791,190 | B2 | 9/2010 | Flores et al. |
| 7,977,252 | B2 | 7/2011 | Smirnov et al. |
| 2002/0142704 | A1 | 10/2002 | Hu et al. |
| 2003/0152787 | A1 | 8/2003 | Arakawa et al. |
| 2003/0171076 | A1 | 9/2003 | Moloney et al. |
| 2003/0183270 | A1* | 10/2003 | Falk et al. ............ 136/258 |
| 2004/0070829 | A1 | 4/2004 | Kurtz et al. |
| 2004/0129135 | A1 | 7/2004 | Roark et al. |
| 2004/0174596 | A1 | 9/2004 | Umeki |
| 2004/0201890 | A1 | 10/2004 | Crosby |
| 2005/0046943 | A1 | 3/2005 | Suganuma |
| 2006/0205875 | A1 | 9/2006 | Cha et al. |
| 2006/0273067 | A1 | 12/2006 | Smirnov et al. |
| 2007/0012355 | A1 | 1/2007 | LoCascio et al. |
| 2007/0082457 | A1 | 4/2007 | Chou et al. |
| 2009/0162966 | A1* | 6/2009 | Jawarani et al. ............ 438/67 |
| 2011/0232744 | A1* | 9/2011 | Larsen et al. ............ 136/256 |
| 2011/0248386 | A1 | 10/2011 | Smirnov et al. |

FOREIGN PATENT DOCUMENTS

| | | | |
|---|---|---|---|
| RU | 2180885 | C1 | 3/2002 |
| RU | 2204179 | C1 | 5/2003 |
| RU | 2231171 | C1 | 6/2004 |
| RU | 2240280 | C1 | 11/2004 |
| RU | 2321101 | C1 | 3/2008 |
| TW | 200939471 | A | 9/2009 |
| WO | 2005/050697 | A2 | 6/2005 |

OTHER PUBLICATIONS

Karen, A. et al., "Quantitative Investigation of the O2+-Induced Topography of GaAs and other III-V Semiconductors: an STM Study of the Ripple Formation and Suppression of the Secondary Ion Yield Change by Sample Rotation," Surface and Interface Analysis, vol. 23, 1995, pp. 506-513.

Vajo, J.J. et al., "Influence of O2+ Energy, Flux, and Fluence on the Formation and Growth of Sputtering-Induced Ripple Topography on Silicon," Journal of Vacuum Science and Tecnology A. 14(5), 1996, pp. 2709-2720.

International Search Report and Written Opinion for International Patent Application No. PCT/US2006/011420 mailed Jun. 26, 2008.

International Search Report and Written Opinion for International Patent Application No. PCT/US2006/021564 mailed Jul. 28, 2008.

International Search Report and Written Opinion for International Patent Application No. PCT/RU2011/000631 mailed Mar. 1, 2012.

International Search Report and Written Opinion for International Patent Application No. PCT/RU2011/000489 mailed Mar. 1, 2012.

International Search Report and Written Opinion for International Patent Application No. PCT/RU2011/00594 mailed Apr. 19, 2012.

European Search Report for European Patent Application No. 06851545.1 mailed Feb. 8, 2010.

Official Communication for U.S. Appl. No. 11/100,175 mailed Oct. 24, 2007.

Official Communication for U.S. Appl. No. 11/100,175 mailed May 16, 2008.

Official Communication for U.S. Appl. No. 11/100,175 mailed Feb. 9, 2009.

Official Communication for U.S. Appl. No. 11/100,175 mailed Jun. 11, 2009.

Official Communication for U.S. Appl. No. 11/385,355 mailed Mar. 7, 2011.

Official Communication for U.S. Appl. No. 11/421,384 mailed Aug. 21, 2008.

Official Communication for U.S. Appl. No. 11/421,384 mailed Apr. 24, 2009.

Official Communication for U.S. Appl. No. 11/421,384 mailed Sep. 3, 2009.

Official Communication for U.S. Appl. No. 11/421,384 mailed Mar. 22, 2010.

* cited by examiner

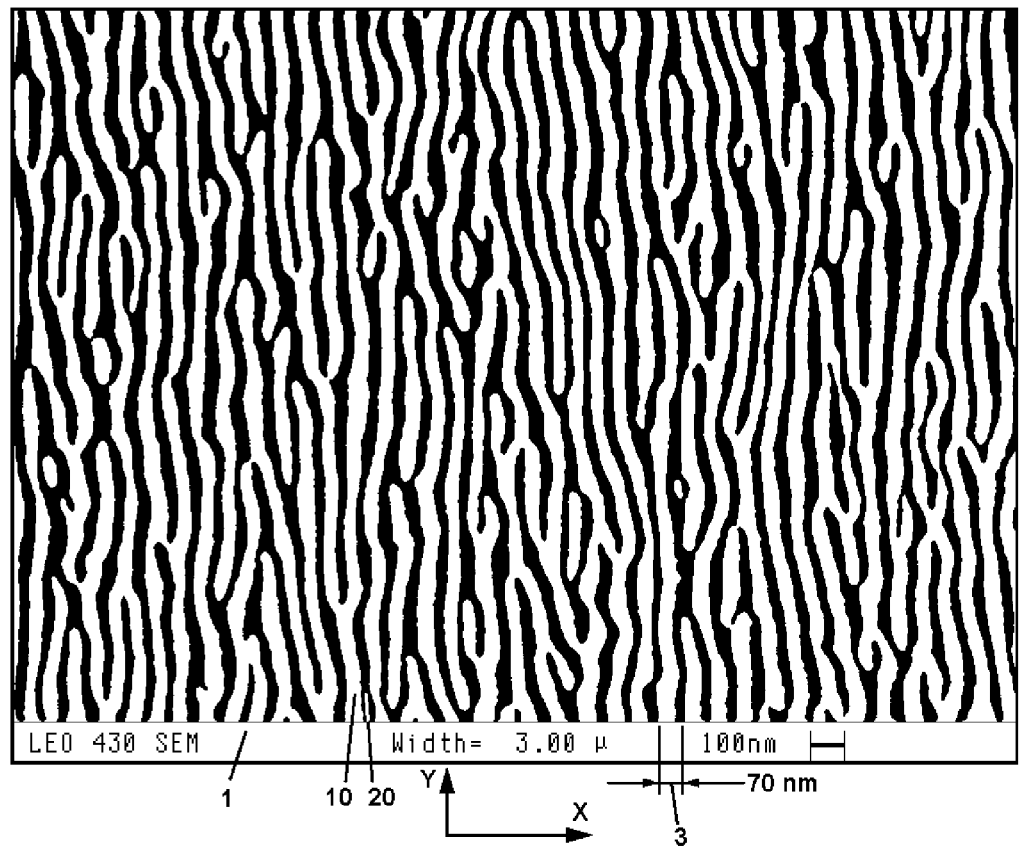
FIG. 1A
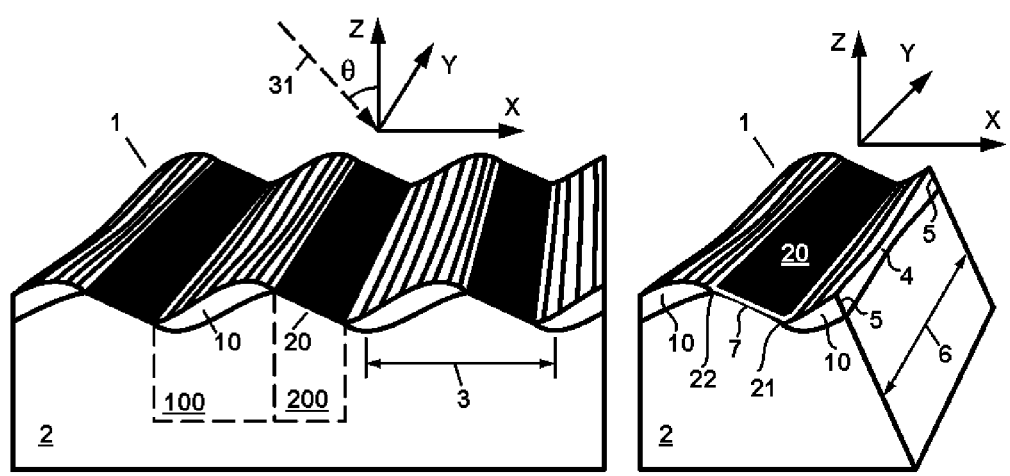
FIG. 1B
FIG. 1C

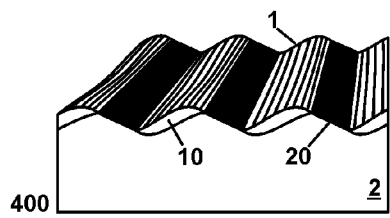
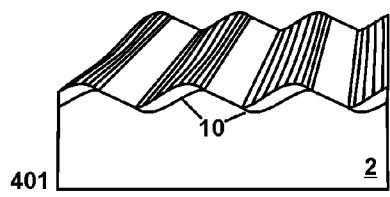
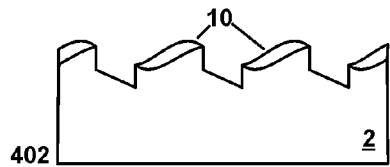
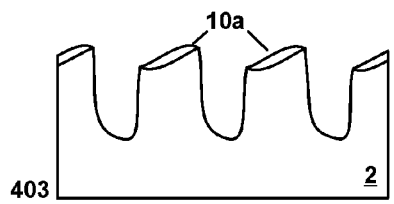
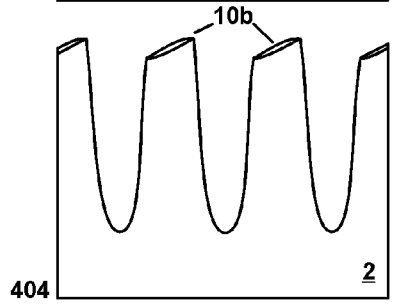
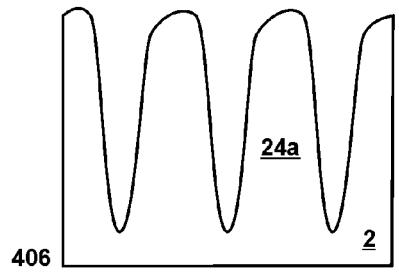
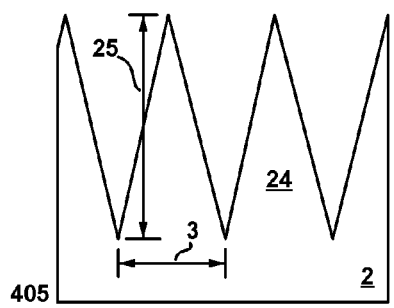
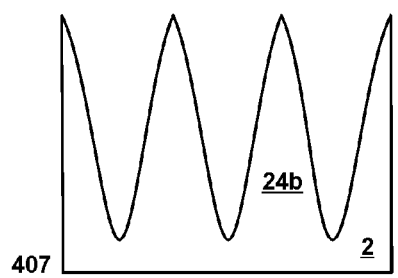
FIG. 2A
FIG. 2B

US 8,859,888 B2

SOLAR CELL WITH NANOSTRUCTURED LAYER AND METHODS OF MAKING AND USING

CROSS-REFERENCE TO RELATED APPLICATIONS

This application is a Continuation of PCT Patent Application No. PCT/RU2011/000631, filed on Aug. 19, 2011, which is a Continuation-in-Part of PCT Patent Application No. PCT/RU2011/000489, filed on Jul. 6, 2011, both of which are incorporated herein by reference.

FIELD

The invention relates to the field of semiconductor devices for converting light energy into electric energy, in particular to the field of solar photovoltaic (PV) cells including cells based on monocrystalline and polycrystalline silicon. The invention also relates to the technology of forming nanostructured elements on the surface of silicon solar wafers to reduce the reflection of light from their surface.

BACKGROUND

There is a general interest in the manufacture and use of solar cells as an alternative method for energy creation. FIG. 15A illustrates one type of conventional selective emitter solar cell. This solar cell includes a silicon wafer 150a with a base region 151a of p-type conductivity, diffusion regions 162 of $p^+$-type, a low doped emitter layer 153 of n-type, a thin antireflection layer 154 covering the emitter layer, highly doped diffusion regions 163 of $n^+$-type (selective emitter), contacts 155 extending through the layer 154 to regions 163, a layer of silicon oxide 156 with openings to the regions 162 of $p^+$-type, and a metallization layer 157 as a rear contact. The surface of the wafer 150a has a pyramidal texture to improve light capture. The base width of the pyramids is from a few micrometers to a few tenths of micrometers. In this arrangement, the junction between the emitter layer 153 and the base region 151a is not planar and has a surface area of a structured pyramidal junction which is 1.7 times larger than the surface of a planar junction. The larger junction surface area results in 1.7 times lager solar cell saturation current thus reducing cell efficiency.

One type of conventional back-contact solar cell is illustrated in FIG. 15B and has a silicon wafer 150b with a base region 151b of n-type conductivity, interdigitated regions 164 of $p^+$-type and regions 165 of $n^+$-type, a front surface field layer 166 of $n^+$-type having a pyramidal textured surface, a thin antireflection layer 154 covering the field layer 166, a layer of silicon oxide 156 with openings to regions 164 and 165, and contacts 176 connected to the regions 164 and 165. In this arrangement, the junction between the front surface field layer 166 and the base region 151b is not planar and has a surface area of a structured pyramidal junction which is 1.7 times larger than the surface of planar junction. The larger junction surface area results in 1.7 times lager solar cell saturation current thus reducing cell efficiency.

FIG. 15C illustrates an example of one type of conventional bifacial solar cell that includes a silicon wafer 150c with a base region 151c of p-type conductivity, a diffusion layer 142 of $p^+$-type (back surface field layer), an emitter layer 153a of $n^+$-type having a pyramid texture surface, a thin antireflection layer 154 covering the emitter layer 153a, front contacts 155 through the antireflection layer 154 to the emitter 153a, and bottom contacts 155 through the antireflection layer 154 to the back surface field layer 142. In this arrangement, the junction between the emitter layer 153a and the base region 151c is not planar and has a surface area of a structured pyramidal junction which is 1.7 times larger than the surface of planar junction. The larger junction surface area results in 1.7 times lager solar cell saturation current thus reducing cell efficiency.

FIG. 15D illustrates an example of one type of conventional symmetrical bifacial solar cell that includes a silicon wafer 150d with a base region 151d of p-type conductivity, a diffusion layer 142a of $p^+$-type (back surface field layer) having a pyramid texture surface, a thin antireflection layer 154 covering the diffusion layer, an emitter layer 153a of $n^+$-type having a pyramid texture surface, a thin antireflection layer 154 covering the emitter layer, front contacts 155 through the antireflection layer 154 to the emitter 153a, and bottom contacts 155 through the antireflection layer 154 to the back surface field layer 142a. In this arrangement, both junctions between the emitter layer 153a and the base region 151d and between the back surface field layer 142a and the base region 151d are not planar and have surface areas of structured pyramidal junctions which are 1.7 times larger than the surface of planar junction. The larger junction surface areas result in 3.4 times larger solar cell saturation current thus reducing cell efficiency.

BRIEF SUMMARY

One embodiment is a solar cell including a base and a nanostructured layer formed on the base. The nanostructured layer has a nanostructured surface opposite the base. The nanostructured surface has a quasi-periodic, anisotropic array of elongated ridge elements having a wave-ordered structure pattern, each ridge element having a wavelike cross-section and oriented substantially in a first direction.

Another embodiment is a semiconductor device including a silicon base region and a doped layer disposed on the silicon base region. The doped layer includes silicon doped with a first dopant of a first conductivity type. The doped layer has a nanostructured surface opposite the base. The nanostructured surface has a quasi-periodic, anisotropic array of elongated ridge elements having a wave-ordered structure pattern, each ridge element having a wavelike cross-section and oriented substantially in a first direction.

Yet another embodiment is a method of making a semiconductor device. The method includes irradiating a surface of a wafer with an oblique beam of nitrogen ions to form a nanomask. The nanomask has a quasi-periodic, anisotropic array of elongated elements having a wave-ordered structure pattern and a wave-like cross-section with wave crests that are substantially perpendicular to a plane of incidence of the nitrogen ions. The method further includes etching the surface of the wafer with the nanomask to generate a nanostructured surface corresponding to the nanomask; and forming a doped layer in the wafer, the doped layer comprising the nanostructured surface.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description, which is to be read in association with the accompanying drawings, wherein:

FIG. 1A is a scanning electron microscope (SEM) top view of a nanomask having a period of 70 nm formed on a silicon surface using a $N_2^+$ ion beam with energy E=5 keV at the angle of bombardment θ=53° from surface normal, according to the invention;

FIG. 1B is a perspective view of elongated elements of a nanomask and their cross-section, according to the invention;

FIG. 1C is a perspective view of elongated elements of a nanomask, their cross-section, and longitudinal section along the element, according to the invention;

FIG. 2A to 2B are cross-section views of a nanomask presented during a sequential transformation into a quasiperiodic array of silicon nanoridges with sawtooth cross-section during RIE process and subsequent wet etching, according to the invention;

DETAILED DESCRIPTION

The invention relates to the field of semiconductor devices for converting light energy into electric energy, in particular to the field of solar photovoltaic (PV) cells including cells based on monocrystalline and polycrystalline silicon. The invention also relates to the technology of forming nanostructured elements on the surface of silicon solar wafers to reduce the reflection of light from their surface.

For example, a solar cell includes a silicon wafer with nanostructured elements formed on a surface of the layer. The nanostructured elements may be formed using a wavelike silicon nitride nanomask that is self-formed during the irradiation of the silicon wafer surface by a beam of nitrogen ions. After etching, such as reactive ion etching (RIE), the nanomask transforms into a dense quasiperiodic, anisotropic array of nanoridges with substantially equal heights on the silicon surface.

Figure 14A:
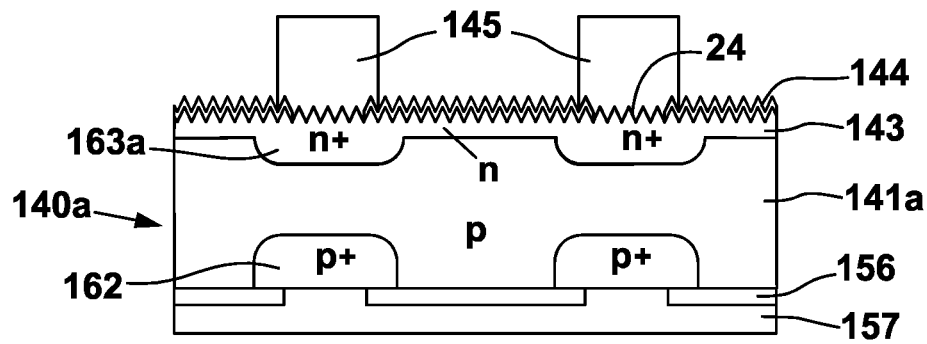
FIG. 14A is a schematic cross-sectional view of one embodiment of a solar cell, according to the invention.

FIG. 14A illustrates one embodiment of a selective emitter solar cell that includes a silicon wafer 140a with a base region 141a of p-type conductivity, diffusion regions 162 of $p^+$-type, a low doped emitter layer 143 of n-type having a nanostructured surface with nanoridges 24, a thin passivation layer 144 covering the emitter layer 143, contacts 145 extending through the layer 144 to highly doped diffusion regions 163a of $n^+$-type (selective emitter), a layer of silicon oxide 156 with openings to regions 162, and a metallization layer 157 as a rear contact.

Figure 15A:
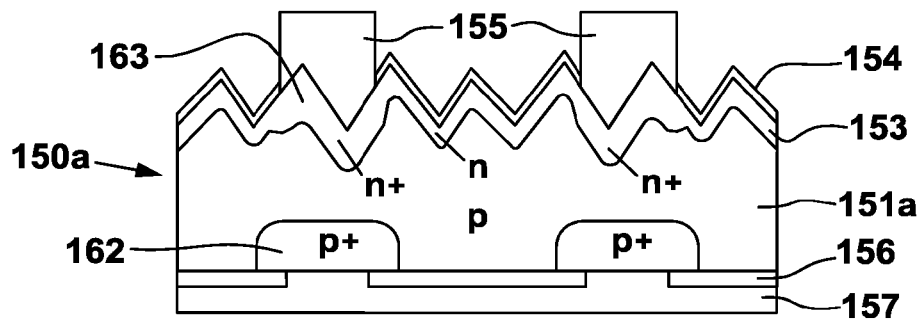
FIGS. 15A to 15D are schematic cross-sectional views of several types of conventional solar cells.

One distinctive feature of this solar cell over conventional selective emitter solar cells, such at that illustrated in FIG. 15A, is that the bottom of the emitter layer 143 is flat whereas the emitter of the solar cell of FIG. 15A is not flat and follows the pyramid surface texture of the wafer. This feature of the solar cells described herein is due, at least in part, to the very small size of the nanoridges 24 in comparison with the p-n junction depth and the p-n junction formation methods described below. The flat emitter has less surface area which may provide the advantage of lower saturation current of the solar cell resulting in higher conversion efficiency. A planar p-n junction can result in higher conversion efficiency, as compared to a non-planar junction such as the solar cell of FIG. 15A.

In addition, there may be no need for an antireflection coating in the solar cell with the nanostructured surface as the nanostructured surface can have very low reflection. The passivation layer 144 may be formed using, for example, silicon oxide, aluminum oxide ($Al_2O_3$), or hydrogenated silicon nitride (SiN), or the like.

Figure 14B:
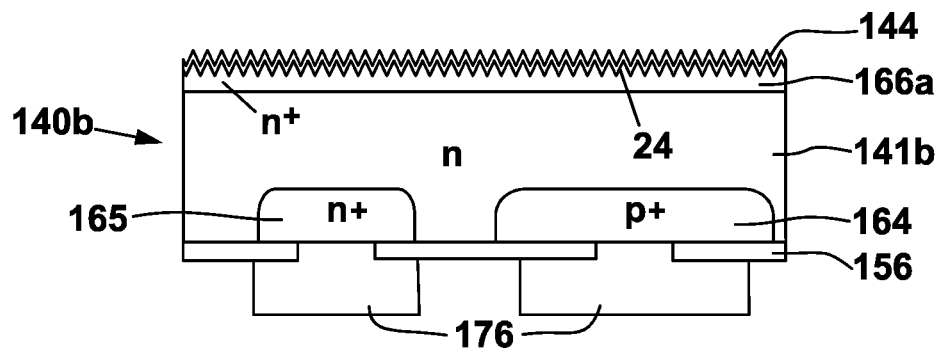
FIG. 14B is a schematic cross-sectional view of a second embodiment of a solar cell, according to the invention.
Figure 15B:
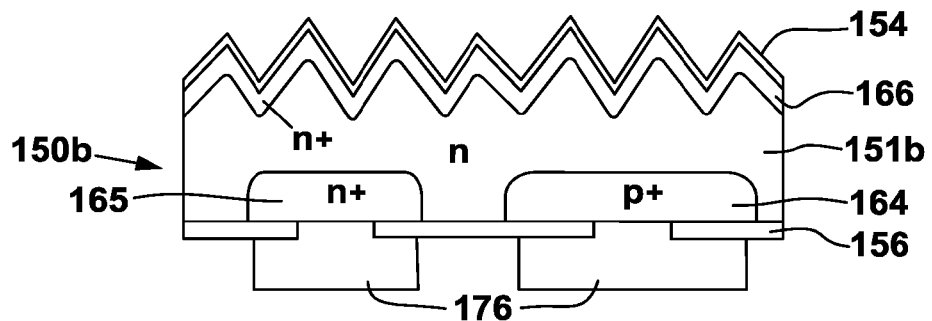

An embodiment of a back-contact solar cell is illustrated in FIG. 14B and has a silicon wafer 140b with a base region 141b of n-type conductivity, interdigitated regions 164 of $p^+$-type and regions 165 of $n^+$-type, a front surface field layer 166a of $n^+$-type having a nanostructured surface with nanoridges 24, a thin passivation layer 144 covering the front surface field layer, a layer of silicon oxide 156 with openings to regions 164 and 165, and contacts 176 connected to the regions 164 and 165. In this embodiment, the junction between the front surface field layer 166a and the base region 141b is planar with less surface area than a structured pyramidal junction shown in FIG. 15B which may reduce solar cell saturation current resulting in a higher cell efficiency.

Figure 14C:
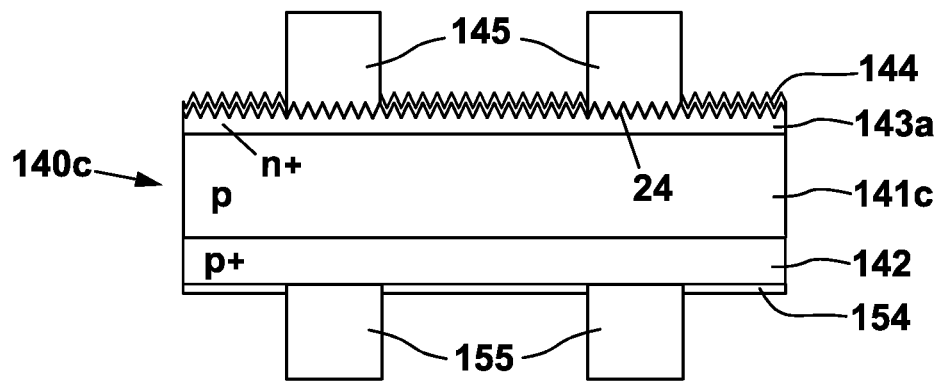
FIG. 14C is a schematic cross-sectional view of a third embodiment of a solar cell, according to the invention.
Figure 15C:
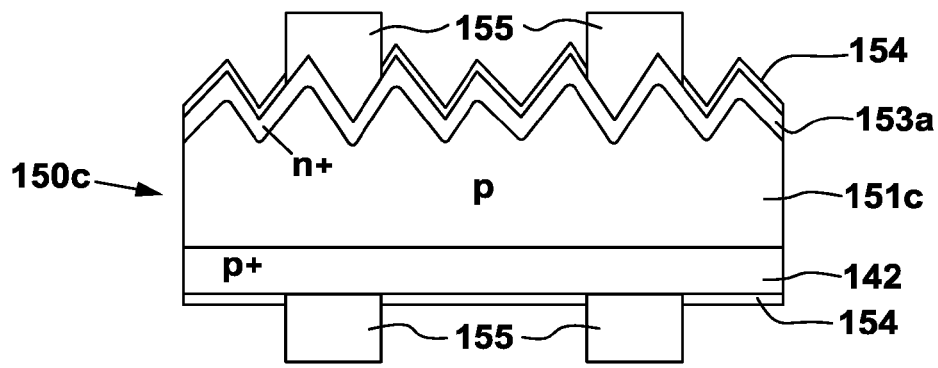

An embodiment of a bifacial solar cell is illustrated in FIG. 14C and has a silicon wafer 140c with a base region 141c of p-type conductivity, a diffusion layer 142 of $p^+$-type (back surface field layer), an emitter layer 143a of $n^+$-type having a nanostructured surface with nanoridges 24, a thin passivation layer 144 covering the emitter layer, front metal contacts 145 extending through the layer 144 to the emitter layer 143a, and rear metal contacts 155 extending through the antireflection layer 154 to the back surface field layer 142. In this embodiment, the junction between the emitter layer 143a and the base region 141c is planar with less surface area than a structured pyramidal junction shown in FIG. 15C which may reduce solar cell saturation current resulting in a higher cell efficiency.

Figure 14D:
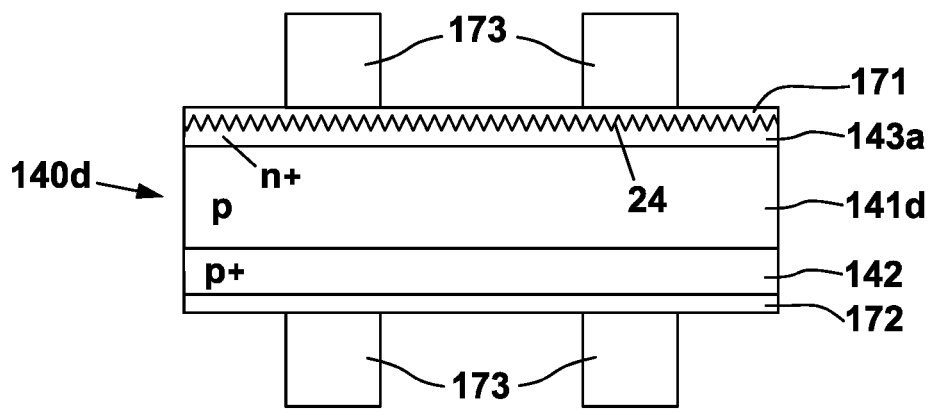
FIG. 14D is a schematic cross-sectional view of a fourth embodiment of a solar cell, according to the invention.

Another embodiment of a bifacial solar cell is illustrated in FIG. 14D and has a silicon wafer 140d with a base region 141d of p-type conductivity, a diffusion layer 142 of $p^+$-type (back surface field layer), an emitter layer 143a of $n^+$-type having a nanostructured surface with nanoridges 24, a thin layer of transparent conductive oxide (TCO) 171 covering the emitter layer, and metal contacts 173 connected to the front TCO layer 171 and to the back TCO layer 172. A prototype of this solar cell (2×2 cm$^2$) fabricated on Czochralski type monocrystalline silicon wafer using 80-nm-thick $In_2O_3$ layer as the TCO has demonstrated a conversion efficiency of 18.6%.

Figure 14E:
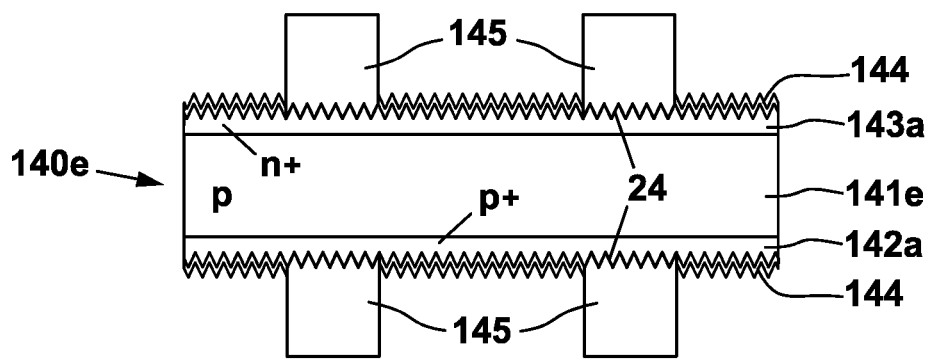
FIG. 14E is a schematic cross-sectional view of a fifth embodiment of a solar cell, according to the invention.
Figure 15D:
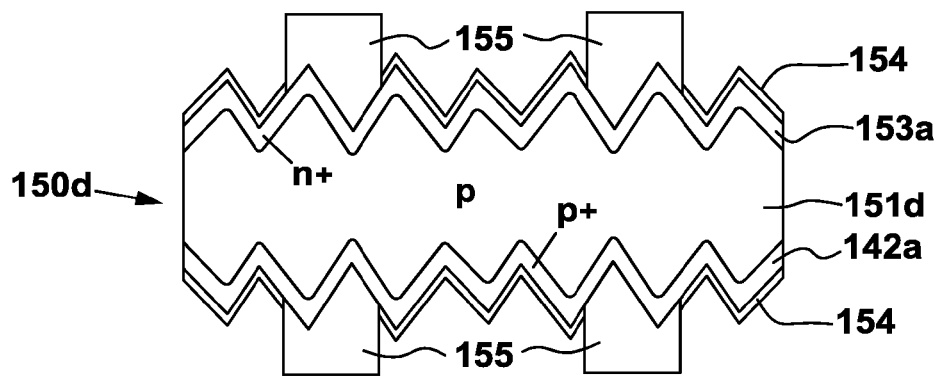

An embodiment of a symmetrical bifacial solar cell is illustrated in FIG. 14E and has a silicon wafer 140e with a base region 141e of p-type conductivity, a diffusion layer 142a of $p^+$-type (back surface field layer) having a nanostructured surface with nanoridges 24, a thin passivation layer 144 covering the diffusion layer, an emitter layer 143a of $n^+$-type having a nanostructured surface with nanoridges 24 covered by a thin passivation layer 144, front metal contacts 145 extending through the layer 144 to the emitter layer 143a, and back metal contacts 145 extending through the layer 144 to the back surface field layer 142a. In this embodiment, both junctions between the emitter layer 143a and the base region 141e and between the back surface field layer 142a and the base region 141e are planar with less surface area than a structured pyramidal junction shown in FIG. 15D which may reduce solar cell saturation current resulting in a higher cell efficiency. The nanoridges on front and back wafer surfaces may have parallel, perpendicular or angled relative orientation to optimize light capture.

Figure 14F:
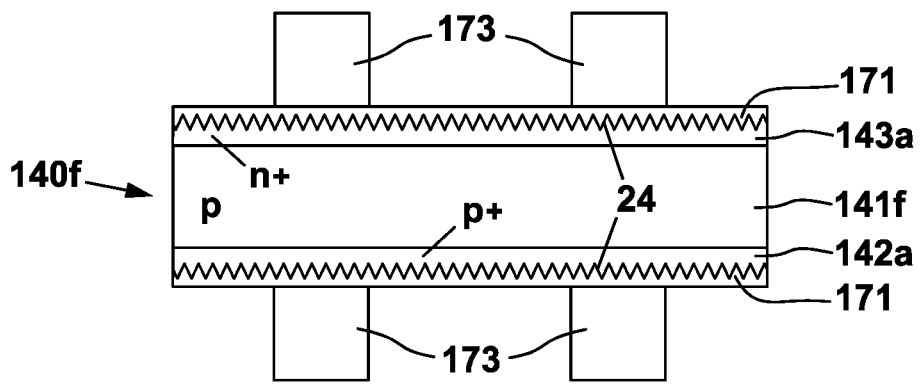
FIG. 14F is a schematic cross-sectional view of a sixth embodiment of a solar cell, according to the invention.

Another embodiment of a symmetrical bifacial solar cell is illustrated in FIG. 14F and has a silicon wafer 140f with a base region 141f of p-type conductivity, a diffusion layer 142a of $p^+$-type (back surface field layer) having a nanostructured surface with nanoridges 24, a thin TCO layer 171 covering the diffusion layer, an emitter layer 143a of $n^+$-type having a nanostructured surface with nanoridges 24 covered by a thin TCO layer 171, and front and back metal contacts 173 to the TCO layers. In this embodiment, both junctions between the emitter layer 143a and the base region 141f and between the back surface field layer 142a and the base region 141f are planar with less surface area than a structured pyramidal junction shown in FIG. 15D which may reduce solar cell saturation current resulting in a higher cell efficiency. The nanoridges on front and back wafer surfaces may have parallel, perpendicular or angled relative orientation to optimize light capture.

Figure 14G:
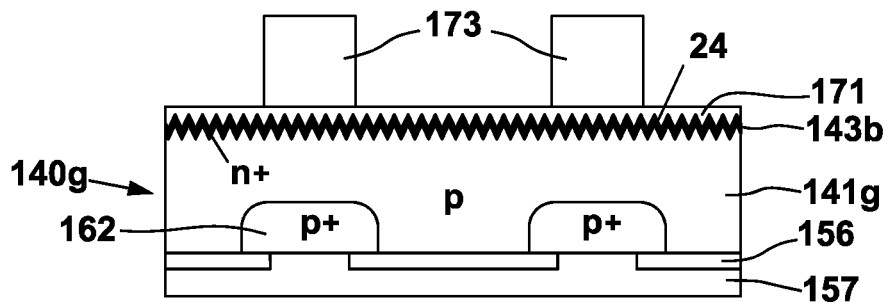
FIG. 14G is a schematic cross-sectional view of a seventh embodiment of a solar cell, according to the invention.

Another embodiment of a solar cell is illustrated in FIG. 14G and has a silicon wafer 140g with a base region 141g of p-type conductivity, an ultra shallow emitter layer 143b of $n^+$-type or n-type having a nanostructured surface with nanoridges 24 covered by a thin TCO layer 171, front metal contacts 173 to the TCO layer, diffusion regions 162 of $p^+$-type, a layer of silicon oxide 156 with openings to regions 162, and a metallization layer 157 as a rear contact. In this embodiment, an ultra shallow emitter layer 143b with the thickness of about 10 nm or less can be made, for example, by epitaxial growth of doped silicon. The tops of nanoridges 24 can be tightly enveloped by, for example, an indium tin oxide layer (ITO) used as a TCO to effectively catch charge carriers generated by light at the tops of the nanoridges. Although not wishing to be limited to any particular theory, it is believe that the solar cell arrangements described herein may result in multiple exciton generation (MEG). MEG refers to the generation of multiple excitons (e.g., electron-hole pairs) by a single photon. To facilitate MEG the tops of nanoridges 24 or nanopeaks 26 preferably have sufficient sharpness to provide quantum confinement effects in the emitter layer. As an example, the radius of their curvature R is no more than 5 nm (as shown in FIG. 14I) to provide a width of the ridge near the peak of no more than 10 nm which is sufficient for quantum confinement effects in silicon at room temperature.

Figure 14H:
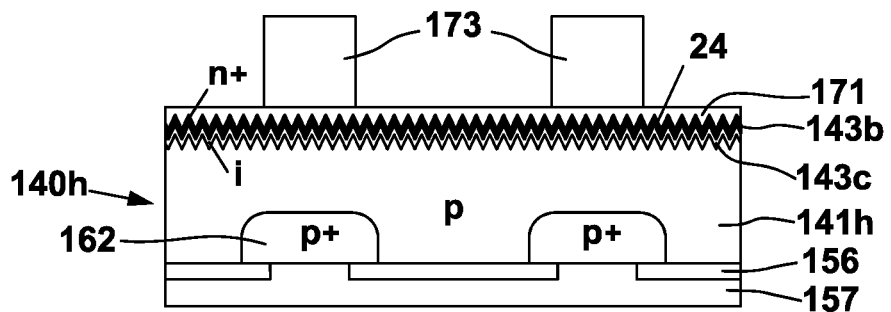
FIG. 14H is a schematic cross-sectional view of an eighth embodiment of a solar cell, according to the invention.
Figure 14I:
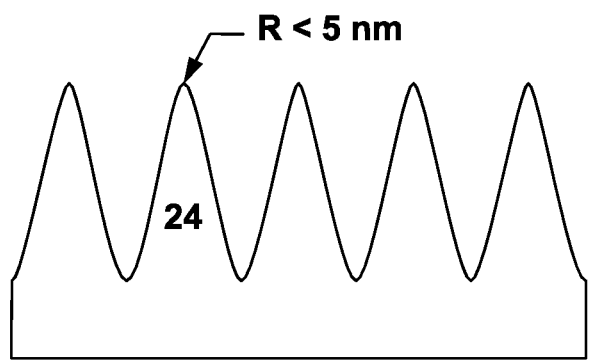
FIG. 14I is a cross-sectional view of nanoridges with sharp tops enabling multiple exciton generation (MEG)

Another embodiment of a solar cell is illustrated in FIG. 14H and has a silicon wafer 140h with a base region 141h of p-type conductivity, an ultra shallow emitter layer 143b of $n^+$-type or n-type having a nanostructured surface with nanoridges 24 covered by a thin TCO layer 171, a layer of intrinsic silicon 143c between the base region 141h and the emitter layer 143b, front metal contacts 173 to the TCO layer, diffusion regions 162 of $p^+$-type, a layer of silicon oxide 156 with openings to regions 162, and a metallization layer 157 as a rear contact. In this embodiment, an ultra shallow emitter layer 143b and intrinsic layer 143c both with the thickness of about 10 nm or less can be made, for example, by sequential epitaxial growth of undoped and doped silicon on the nanostructured surface of the base region. The tops of nanoridges 24 can be tightly enveloped by, for example, an indium tin oxide layer (ITO) used as a TCO to effectively catch charge carriers generated by light at the tops of the nanoridges. To facilitate MEG the tops of nanoridges 24 or nanopeaks 26 preferably have sufficient sharpness to provide quantum confinement effects in the emitter layer. As an example, the radius of their curvature R may be no more than 5 nm (as shown in FIG. 14I) to provide a width of the ridge near the peak of no more than 10 nm, which is sufficient for quantum confinement effects in silicon at room temperature.

The quantum confinement effects at the tops of nanoridges due to their small size (for example, a size of no more than 10 nm) in solar cells, such as those illustrated in FIGS. 14D, 14F, 14G, and 14H (with a TCO layer that envelops the tops of nanoridges 24) may lead to the manifestation of MEG, thus adding a contribution to the efficiency of the solar cell. Instead of nanoridges 24, nanopeaks 26 may be used to produce the MEG effect. The MEG effect can increase solar cell efficiency by up to 10% or more.

The embodiments of FIGS. 14A-14F are examples of solar cells. It will be understood that other types of solar cell configurations can be modified to include a nanostructured surface. It will also be understood that other semiconductor devices can also be formed with a nanostructured surface. It will also be understood that the embodiments described above can be modified by replacing p-type regions with n-type regions and vice versa. It will also be understood that surfaces of monocrystalline silicon wafers having either (100) or (111) or any other orientation, as well as surfaces of polycrystalline silicon wafers, can be made nanostructured. Methods of forming p-type, n-type, $p^+$-type, and $n^+$-type regions using n-type and p-type dopants to dope a silicon wafer, as well as methods of forming passivation layers, contacts, transparent conductive oxide layers, silicon oxide layers, and the like are generally known and any suitable method can be used for forming these structures.

Methods of forming a nanomask on a silicon wafer are described in U.S. Pat. No. 7,768,018 and U.S. Patent Application Publication No. 2008/0119034, both of which are incorporated herein by reference. Ultra thin membranes based on wave-ordered structure patterns are described in U.S. Pat. No. 7,604,690, which is incorporated herein by reference. In at least some embodiments, a wavelike silicon nitride nanomask is formed by irradiation of the surface of a silicon solar wafer by a beam of nitrogen ions and then etching (e.g., wet etching or reactive ion etching) to create a nanostructured surface of the silicon wafer in the form of a dense quasiperiodic array of nanoridges or nanopeaks. This nanomask can be used for fabricating photovoltaic solar cells from a wafer with a nanostructured surface. In at least some embodiments, the average period of the array is controllably varied in a range from 20 to 150 nm (or 20 to 180 nm or 20 to 200 nm) to increase the performance of solar cells. This process is reliably reproducible and forms a uniform wavelike silicon nitride nanomask, as well as a nanostructure on the surface of wafers of silicon.

In at least some embodiments, a hard nanomask includes a plurality of elements as quasi-periodic, anisotropic array of elongated elements having a wave-ordered structure pattern and a wavelike cross-section. At least some of the elements have the following structure in cross-section: an inner region of silicon, and a first outer region of silicon nitride covering a first portion of the inner region and being formed from silicon by a nitrogen ion beam. In at least some embodiments, the first outer regions form a net-like or an island-like structure or any combination thereof. In at least some embodiments, the average period of the array is in a range from 20 to 150 nm (or 20 to 180 nm or 20 to 200 nm). In at least some embodiments, the silicon is a solar cell grade monocrystalline or polycrystalline silicon.

In at least some embodiments, the nanomask further includes, in cross-section, a second outer region of silicon nitride formed from silicon by irradiation using a nitrogen ion beam, covering a second portion of the inner region, and connecting with the first outer region at a wave crest, where the first outer region is substantially thicker than the second outer region. In at least some embodiments, in cross-section, the thickness of the second outer region is minimal in the middle and increases from the middle towards its borders.

In at least some embodiments, for a beam of nitrogen ions with $N^+$ ions and $N_2^+$ ions in the relative fractions of x and (1−x), respectively, the nanomask average period, the nanomask formation depth, and the ion dose to form the nanomask are (1+x) times greater than those for a $N_2^+$ ion beam. In at least some embodiments, the ion dose for an $N_2^+$ ion beam is in the range $1\times10^{17}$-$5\times10^{17}$ cm$^{-2}$ and the maximum thickness of the first outer region is determined by the formula: T=2(1+x)E, where T is the thickness in nm and E is the ion beam energy in keV.

In at least some embodiments, the thickness of the first outer region quasi-periodically varies along the element. In at least some embodiments, the periodic change in thickness of the first outer region along the element is from 50 to 10% of the maximum thickness for a corresponding change in average array period in a range from 20 to 150 nm (or 20 to 180 nm or 20 to 200 nm). In at least some embodiments, the period of change in thickness of the first outer region is greater than or equal to the average array period.

In at least some embodiments, the nanomask is formed by irradiating the silicon surface using an oblique beam of nitrogen ions until a hard nanomask is formed, the nanomask elements being substantially perpendicular to the projection of the ion flow on the silicon surface.

A silicon wafer for a photovoltaic solar cell can be formed with at least one surface of the wafer comprising a nanostructure having a plurality of nanoridges distributed as a quasi-periodic, anisotropic array of silicon nanoridges having a wave-ordered structure pattern and a wave-like cross-section with essentially equal heights and being formed from a hard nanomask. One example of a wave-like cross section is a sawtooth cross-section with sharp tops and bottoms, although it will be understood that other wave-like cross sections can be formed. The nanomask includes a plurality of elements forming a quasi-periodic, anisotropic array of elongated elements having a wave-ordered structure pattern and a wavelike cross-section. At least some of the elongated elements have the following structure in cross-section: an inner region of silicon, and a first outer region of silicon nitride covering a first portion of the inner region and being formed from silicon by a nitrogen ion beam.

In at least some embodiments, the nanoridges form a net-like or an island-like structure or any combination thereof. In at least some embodiments, the average period of the array of nanoridges is in a range from 20 to 150 nm (or 20 to 180 nm or 20 to 200 nm). In at least some embodiments, the average nanoridge height to average array period ratio is in the range from 2 to 3. In at least some embodiments, the wafer is made of monocrystalline silicon or polycrystalline silicon.

A silicon wafer for a photovoltaic solar cell can be formed with a nanostructured surface comprising a plurality of silicon nanopeaks of essentially equal heights arranged as quasi-periodic rows and formed from a hard nanomask. The nanomask includes a plurality of elements in a quasi-periodic, anisotropic array of elongated elements having a wave-ordered structure pattern and a wavelike cross-section, at least some of the elements having the following structure in cross-section: an inner region of silicon, and a first outer region of silicon nitride covering a first portion of the inner region and being formed from silicon by nitrogen ion beam, where the thickness of the first outer region varying quasi-periodically along the element.

In at least some embodiments, the average period of the array is in a range from 20 to 150 nm (or 20 to 180 nm or 20 to 200 nm). In at least some embodiments, the ratio of nanopeaks height to the quasi-periodic rows period is in the range from 2 to 3. In at least some embodiments, the wafer is made of monocrystalline silicon or polycrystalline silicon.

In at least some embodiments, a photovoltaic solar cell includes a layer of transparent conductor for electric contact to the nanostructured surface of the wafer. In at least some embodiments, the transparent conductor is made from a transparent conductive oxide such as zinc oxide, tin oxide, indium oxide, or indium tin oxide or any combination thereof. In at least some embodiments, the photovoltaic solar cell includes a wafer with a nanostructured surface, a layer of transparent conductor over the nanostructured surface for electric contact to the nanostructured surface, and a grid of metal wires on the surface of the layer of transparent conductor, the wires being positioned substantially perpendicular to the nanoridges.

In at least some embodiments, a photovoltaic module includes a photovoltaic solar cell with a wafer having a nanostructured surface. The module can be positioned relative to the east and west points of the horizon so as the nanoridges are mostly positioned along the east-west line.

A method for nanostructuring the surface of a silicon wafer for a photovoltaic solar cell includes irradiating a surface of the wafer with an oblique beam of nitrogen ions until a hard nanomask is formed. The nanomask includes a quasi-periodic, anisotropic array of elongated elements having a wave-ordered structure pattern and a wavelike cross-section. At least some of the elements have the following structure in cross-section: an inner region of silicon, and a first outer region of silicon nitride covering a first portion of the inner region and being formed from silicon by the nitrogen ion beam. The method also includes etching the nanomask and silicon until the nanostructure is formed on the wafer surface.

In at least some embodiments, elongated elements of the hard nanomask are positioned substantially perpendicular to the projection of the ion flow onto the wafer surface. In at least some embodiments, the ion energy is in the range 0.5-8 keV.

In at least some embodiments, during irradiation the wafer moves in the wafer surface plane in the first direction, i.e. perpendicular to the projection of the ion flow onto the wafer surface, with a velocity determined by the formula: V=J×L/D, where V is the velocity, cm/s; J is the density of ion flow in the wafer surface plane, $cm^{-2} \cdot s^{-1}$; L is the width of the ion beam at half of the maximum intensity in the wafer surface plane in the direction of motion, cm; and D is the ion dose for nanomask formation, $cm^{-2}$. In at least some embodiments, the wafer moves perpendicular to the first direction. In at least some embodiments, the ion beam is formed by a linear ion source elongated parallel to the surface of the wafer plane. In at least some embodiments, the intensity of the linear ion beam is nonuniform in the direction of the wafer motion. In at least some embodiments, prior to the irradiation a damaged layer (e.g. from a saw used to cut the wafer) is removed from the wafer surface by a wet removal method using a polishing solution.

In at least some embodiments, etching associated with the formation of both the nanomask and the array of nanoridges is performed by using a wet method, dry method, or ion beam method, or any combination thereof. In at least some embodiments, the etching is performed by reactive ion etching using a plasma with the subsequent removal of the silicon layer damaged by plasma with a wet etching. In at least some embodiments, etching duration is monitored and controlled by the intensity of reflected light from the wafer surface.

In at least some embodiments, the nanostructure includes a plurality of nanoridges as a quasi-periodic, anisotropic array of silicon nanoridges having wave-ordered structure pattern and a sawtooth cross-section with essentially equal height. In at least some embodiments, the nanoridges form a net-like or an island-like structure or any combination thereof. In at least some embodiments, the average period of nanoridges array is in the range from 20 to 150 nm (or 20 to 180 nm or 20 to 200 nm). In at least some embodiments, the ratio of nanoridge height to the average period of nanoridges array is in the range from 2 to 3.

In at least some embodiments, in cross-section the nanomask further includes a second outer region of silicon nitride being formed from silicon by nitrogen ion beam, covering a second portion of the inner region, and connecting with the first outer region at a wave crest, where the first outer region is substantially thicker than the second outer region. In at least some embodiments, in cross-section the thickness of the second outer region is minimal in the middle and increases from the middle towards its borders. In at least some embodiments, the thickness of the first outer region varies quasi-periodically along the element. In at least some embodiments, the periodic change in thickness of the first outer region along the element is from 50 to 10% of the maximum thickness for corresponding change in element array period in a range from 20 to 150 nm (or 20 to 180 nm or 20 to 200 nm). In at least some embodiments, the period of change in thickness of the first outer region is greater than or equal to the average array period.

In at least some embodiments, the nanostructure includes a plurality of silicon nanopeaks of essentially equal height arranged as quasi-periodic rows and being formed from a hard nanomask. In at least some embodiments, the average period between the rows is in a range from 20 to 150 nm (or 20 to 180 nm or 20 to 200 nm). In at least some embodiments, the ratio of nanopeak height to average period between the rows is in a range from 2 to 3.

FIG. 1A shows an SEM image with enhanced contrast (without halftones) of a top view of a self-forming wave ordered structure (WOS). The WOS is a wavelike nanomask 1 with an average period 3 (wavelength λ=70 nm). The width of the SEM image is equal to 3 μm. White stripes 10 and black stripes 20 are the opposite slopes of the waves of the WOS.

FIG. 1B shows a perspective, cross-sectional view of the WOS with a cross section of waves in the XZ plane on the surface of silicon 2. The location of the wave slopes 10 and 20 and their orientation are the same as in FIG. 1A (which corresponds to the XY plane). Wave crests are on average parallel to the Y axis, i.e., the array of waves is anisotropic. A single wave (nanomask element) in the cross-section has an inner region of silicon that includes a first part 100 and a second part 200. The wave also has an outer region of silicon nitride that includes a first part 10 and a second part 20 with a low content of implanted nitrogen atoms. Regions 10 and 20 are formed from silicon by irradiation using a beam of nitrogen ions. In at least some embodiments, the ions of the beam have energy in the range from 0.5 to 8 keV in vacuum during nanomask formation. The regions 10 and 20 are connected to each other at a wave crest or peak. The slopes of the waves of nanomask 1 are preferably tilted symmetrically relative to the XY plane. In some embodiments, the slopes are at an angle of about 30°.

As seen in FIG. 1A, the waves of nanomask 1 have breaks, bends, and branches, i.e. connections with each other. Generally, the waves are elongated along the Y-axis and these elongated elements have a length in the range of, for example, 10λ to 30λ. At the same time there are elements having more or less elongation as well as subwavelength point-like elements with a size of less than λ. In general, the array of waves is quasiperiodic, the pattern of the waves is uniform, and one can reproduce these arrays with the same average period and the same average elongation of waves under the same conditions of formation. In at least some embodiments, the period is selected from the range from 20 to 150 nm, or 20 to 180 nm or 20 to 200 nm. A distinctive feature of wavelike nanomask is that its pattern does not contain repeating parts of the array with the same relative positions of the elements, which is due to self-forming nature of nanomask.

A characteristic feature of the topology of nanomask 1 in FIG. 1A is that the regions 10 of some elements are connected to each other, and regions 20 of some elements are also connected to each other, to form a branched structure or a mesh. At the same time there are both separated regions 10 and separated regions 20.

FIG. 1C shows one embodiment of a cross section of a region 10 in its center along the Y-axis, i.e. along the wave in the plane perpendicular to the surface of region 10. In at least some embodiments, the thickness of the region 10 varies along the wave from its thinnest part 4 to thickest parts 5 with a period 6. The maximum thickness of region 10 for a beam of nitrogen ions, with $N^+$ ions and $N_2^+$ ions in the relative fractions of x and (1−x), respectively, is determined, in at least some embodiments, by the formula: $T=2(1+x)E$, where T is the thickness, nm; E is the ion beam energy, keV. For atomic nitrogen ions $N^+$ maximum thickness of the first outer region is two times greater than that for molecular ions $N_2^+$. Nanomask period and its formation depth for the ions $N^+$ are also two times higher than those for the ions $N_2^+$. Beams of $N^+$ ions with energy E/2 and $N_2^+$ ions with energy E form nanomasks with the same average periods and the same thicknesses of the first outer regions at the same formation depths. Thus, for a $N^+/N_2^+$ ion beam the average period (λ) of the nanomask, the thickness of its first outer region (T), the depth of its formation with low wave amplitude ($D_m$), the depth of its formation with grown (saturated) wave amplitude ($D_F$), and the ion doses for corresponding depths of ion sputtering are (1+x) times greater than those values for the pure $N_2^+$ ion beam. In at least some embodiments, the nanomask is formed by the $N_2^+$ ion beam in the ion dose range $5×10^{16}$-$5×10^{17}$ $cm^{-2}$. It may be preferable for the $N_2^+$ ion beam to use the dose range $1×10^{16}$-$5×10^{17}$ $cm^{-2}$. The given regularities are necessary for using industrial ion sources having mixed beams to form nanomasks on solar silicon wafers.

Periodic changes may occur in the thickness of the region 10 along the wave and such change may range from, for example, 50 to 10% of its maximum thickness for the corresponding change in the average period 3 of the array. In some embodiments, the average array period is in the range from 20 to 150 nm (or 20 to 180 nm or 20 to 200 nm). For example, the longer the average period 3, the smaller the relative change in the thickness of region 10. When the nanomask period decreases the relative periodic changes in the thickness of the first outer region along the array elements increases: periodic variation in thickness of the first outer region along the element is from 10 to 50% of its maximum thickness when the array period decreases in the range from 150 to 20 nm (or 180 to 20 nm, or 200 to 20 nm). In at least some embodiments, increasing the average period 3 of the array proportionally increases the thickness of region 10. An average period 6 of the change in thickness of region 10 can be equal to or greater than the average period 3 of the array. Regions 10 in the XZ section plane at the borders 21 and 22 may have a beak-like shape. In at least some embodiments, the thickness of regions 20 in cross-section in XZ plane is smallest at the middle point 7 between the borders 21 and 22 and gradually increases towards the borders 21 and 22.

The nanomask shown in FIGS. 1A to 1C can be formed on the silicon surface by irradiation of the silicon with a beam of nitrogen ions $N_2^+$. In one example, the nanomask is formed using a beam having energy of 5 keV and directed in the XZ plane of incidence along the arrow 31 at an angle θ=53° from Z-axis. The projection of ion flow 31 on the XY plane is along X-axis in this example.

During sputtering of silicon by nitrogen ions a self-forming process takes place resulting in the formation of wavelike nanomask 1. In one example, the depth of sputtering $D_F$=100 nm from the initial level of the silicon surface. In the example, the regions 10 are bombarded by nitrogen ions at near normal angles, and regions 20 are bombarded at glancing angles, which determines the thickness of the regions 10 and 20. Crests of nanomask waves in an array can be predominantly oriented perpendicular to the projection of ion flow on the surface of silicon, (e.g., perpendicular to the X-axis when the ion flow projection is along the X-axis). In at least some embodiments, with decreasing ion energy and increasing ion bombardment angle θ measured from surface normal (Z-axis) the wavelength λ or period 3 of the array can be reduced.

Ion energy can range from, for example, 0.5 to 4 keV for $N^+$ ions and from, for example, 1 to 8 keV for $N_2^+$ ions. Such energy ranges may result in a nanomask period in the range from 20 to 150 nm (or 20 to 180 nm or 20 to 200 nm). In at least some embodiments, the topology of the nanomask 1 does not change for bombardment angles in the range θ=50° to 55°. With the ion energies greater than 8 keV and using $N_2^+$ ion beam, one can form the nanomasks with the periods larger than 150, 180 or 200 nm.

Figure 1D:
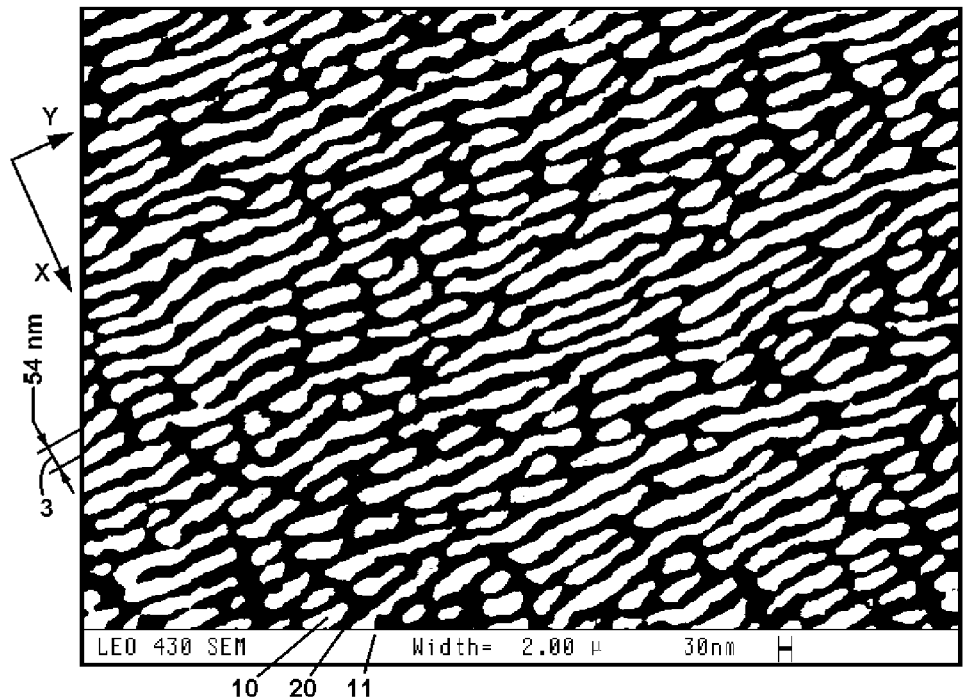
FIG. 1D is a SEM top view of a nanomask with a period of 54 nm formed on a silicon surface using a $N_2^+$ ion beam at E=4 keV, θ=59°, according to the invention.
Figure 1E:
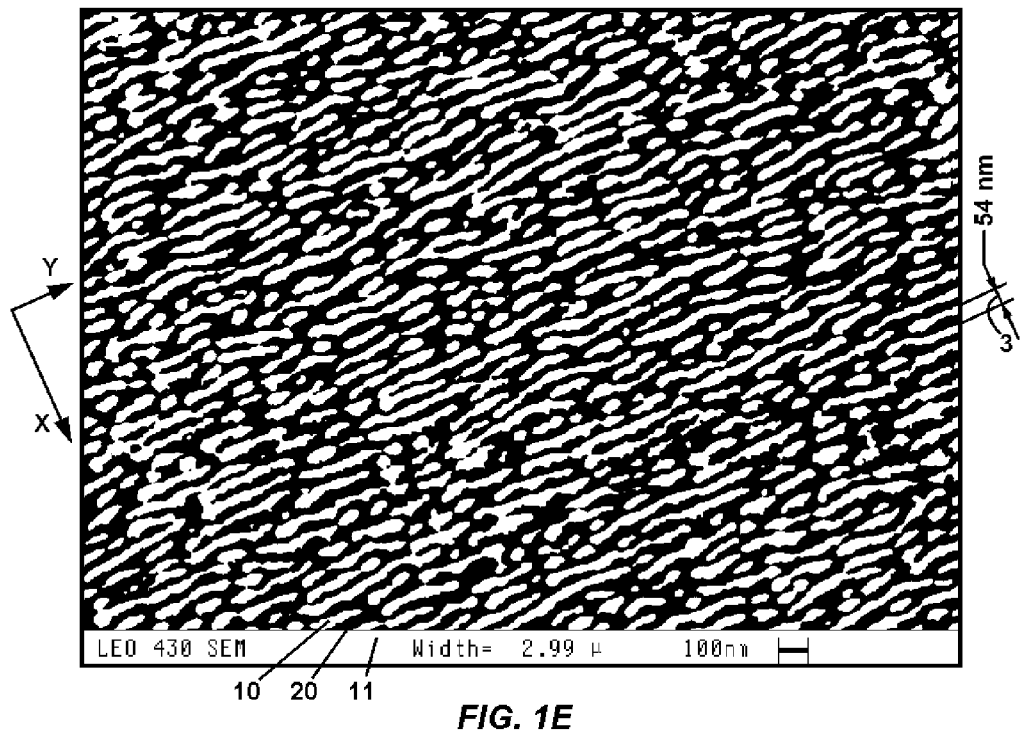
FIG. 1E is a SEM top view of a nanomask with a period of 54 nm formed on a silicon surface using a $N_2^+$ ion beam at E=6 keV, θ=63°, according to the invention.
Figure 1F:
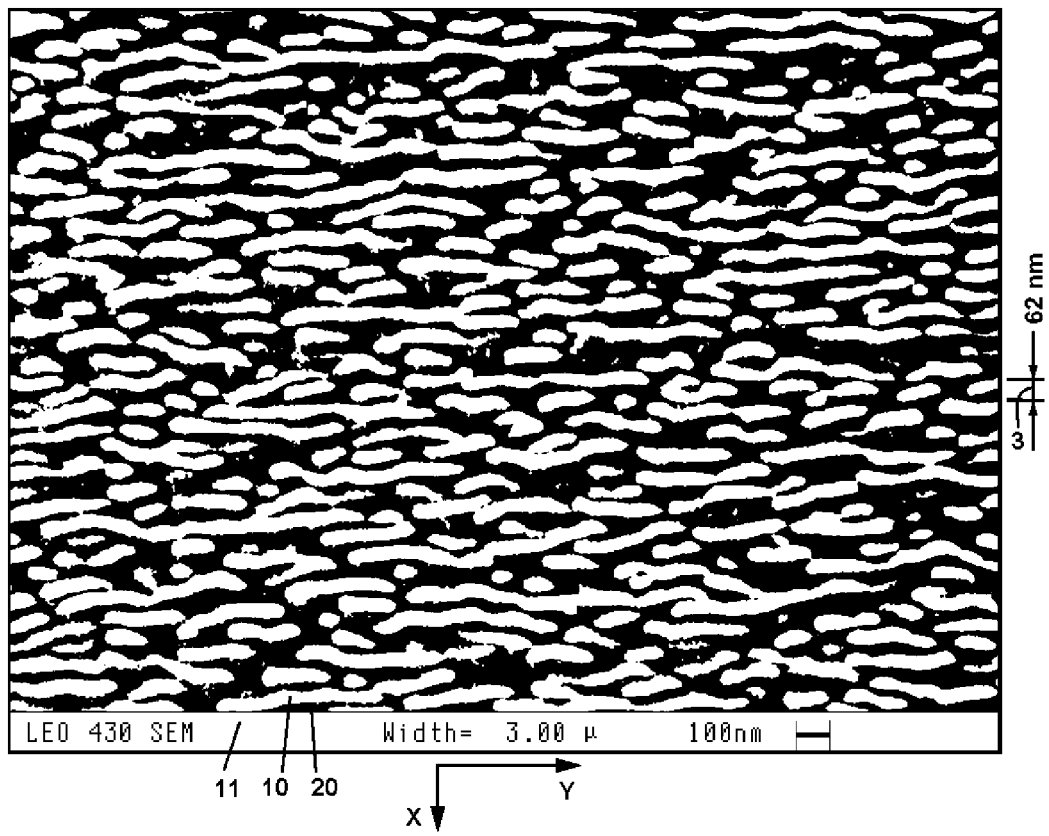
FIG. 1F is a SEM top view of a nanomask with a period of 62 nm formed on a silicon surface using a $N_2^+$ ion beam at E=2 keV, θ=63°, according to the invention.
Figure 1G:
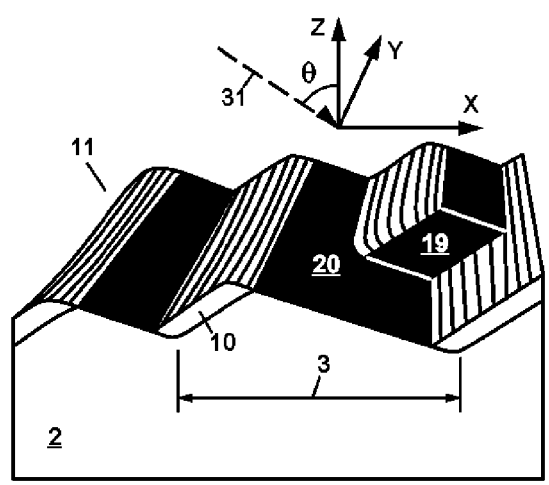
FIG. 1G is a perspective view of elongated elements of a nanomask and their cross-section, according to the invention.

FIGS. 1D to 1F show a nanomask 11 with a topology characterized in that regions 10 are mostly separated from each other and regions 20 are mostly connected to each other in a continuous net. Nanomask 11 is formed by irradiation using a $N_2^+$ beam at greater angles of ion incidence relative to the silicon surface (e.g., angles of about θ=60°-65°.) The cross-section of the elements of nanomask 11, as shown in FIG. 1G, characterized in that regions 10 are mostly tilted relative to the array XY plane at a larger angle than regions 20. The slope of regions 10 is about 30°-35°, and the slope of regions 20 is about 20°-25° to the array plane. End surfaces of typical wave breaks 19 were irradiated by the beam of nitrogen ions at grazing angles of about 70° or more, therefore they are the same thickness as regions 20 and connect regions 20 in a continuous mesh. Wave breaks 19 also occur in nanomask 1.

Figure 1H:
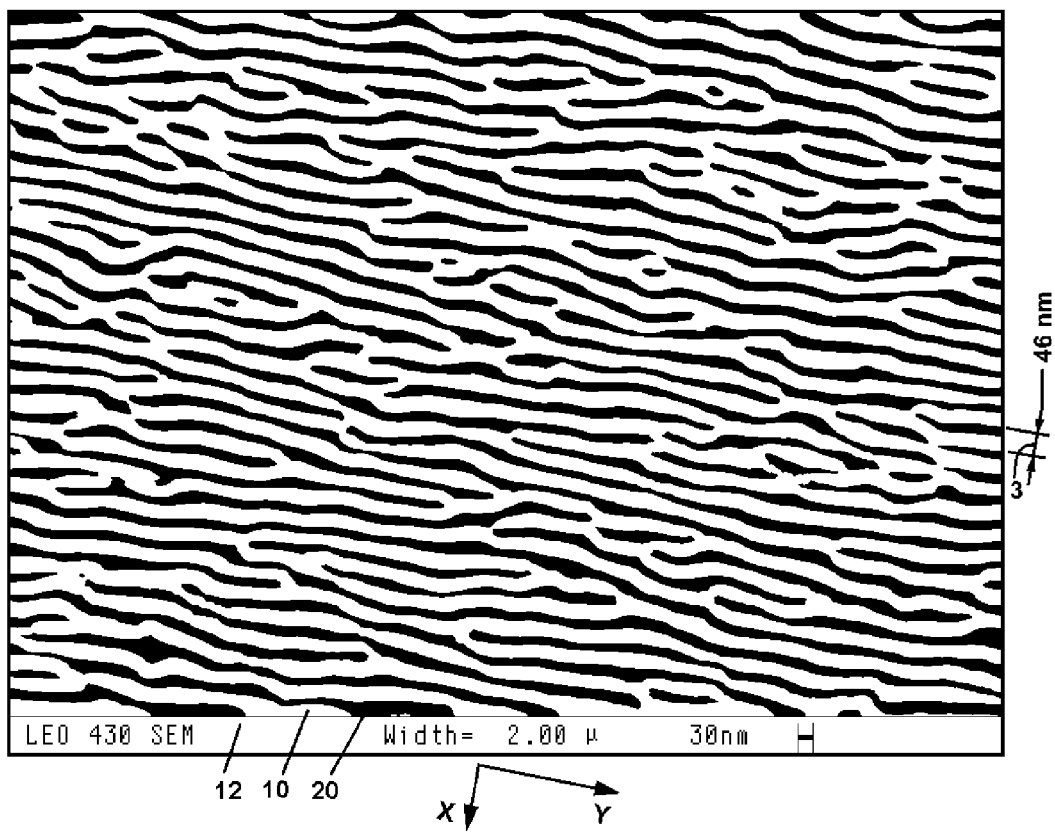
FIG. 1H is a SEM top view of a nanomask with a period of 46 nm formed on a silicon surface using a $N_2^+$ ion beam at E=2 keV, θ=43°, according to the invention.
Figure 1I:
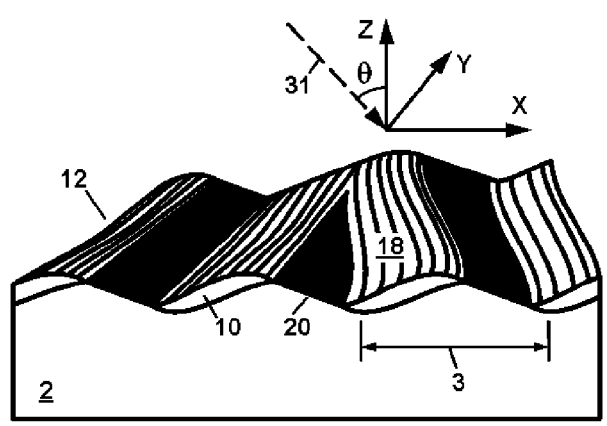
FIG. 1I is a perspective view of elongated elements of a nanomask and their cross-section, according to the invention.

FIG. 1H shows a nanomask 12 with a topology characterized in that regions 10 are mostly connected to each other in a continuous mesh and regions 20 are mostly separated from each other. Nanomask 12 is formed by irradiation using a $N_2^+$ beam at angles of ion incidence relative to the silicon surface of about θ=42°-45°. The cross-section of elements of nanomask 12, as shown in FIG. 1I, is characterized in that regions 10 are generally tilted relative to the array XY plane at a smaller angle than regions 20. The slope of regions 10 is about 25°-30°, and the slope of regions 20 is about 30°-35° relative to the array plane. The surfaces of typical joints of waves 18 were irradiated by nitrogen ion beam at an angle of less than 30°, therefore they are the same thickness as regions 10, and regions 18 connect regions 10 in a continuous mesh. The thickness of regions 18 is slightly smaller than the thickness of regions 10 located parallel to the Y-axis. Wave joints 18 are also seen in nanomasks 1 and 11. Wave breaks 19 also occur in nanomask 12.

It should be noted that in FIGS. 1A to 1I the WOS-nanomasks are shown at the final stage of wave amplitude growth at the sputtering depth $D_F$. In such nanomasks with grown (saturated) wave amplitudes the regions 20 are not formed in all cases, for example, they may be absent for large grazing angles of ion incidence $\theta>65°$ to the initial silicon surface, and when $\theta=45°-65°$ the formation of silicon nitride in regions 20 requires their relaxation in vacuum for tens minutes or exposure to air. In contrast, for WOS-nanomasks at the stage of wave amplitude growth, at the sputtering depth d ($D_m<d<D_F$), both regions 10 and regions 20 are formed, and during the increase in waves amplitude the thickness of regions 10 increases and the thickness of regions 20 decreases. Pronounced periodic changes in the thickness of regions 10 along the nanomask elements are characteristic only for the grown waves. During further sputtering, especially at sputtering depths>$3D_F$, along with the increase in period of WOS-nanomask the periodic changes in the thickness of regions 10 along the nanomask elements weaken. Thus, both the regions 20 and the periodic changes in the thickness of regions 10 along the nanomask elements are not obligatory features of the nanomask, and may develop only under particular conditions.

FIG. 2A shows schematically nanomask 1 transformation stages during the RIE process for the formation of a nanostructured surface with a quasiperiodic array of silicon nanoridges with sawtooth cross-section. If desired, prior to the main RIE stage, ultra-thin regions 20 (<0.5 nm) between nitride regions 10 are removed from the initial structure 400, thus enhancing the contrast of the nanomask 1. This process takes about 2 seconds and may allow one to significantly accelerate the etching of nanomask 1. It can be carried out in both a non-selective plasma He/$CHF_3$ or in the selective plasma $O_2/Cl_2$ of the main RIE stage. In the latter case, the bias on the wafer under etching is briefly raised, which provides a mode for ion sputtering of regions 20. As a result the nanomask 401 is formed without regions 20. Regions 20 can also be removed by wet etching in $HNO_3$/HF solution for a few seconds. When the RIE process is implemented immediately after the formation of the WOS-nanomask without its exposure in air the step of removing regions 20 may not be performed, because these regions often do not occur.

The main RIE stage includes etching silicon in a chlorine $O_2/Cl_2$ plasma that is selective to nitride, resulting in the structures 402-405. The main RIE stage takes, for example, 20 seconds, which provides a potential of high process productivity. Initially, during the etching of silicon 2 in the structure 402 the walls of the trenches between the regions 10 of silicon nitride are etched vertically. The etching process results in gradual decrease in the thickness of regions 10 of silicon nitride, and these regions 10 transform into regions 10a and 10b. The walls of the trenches become inclined resulting in the structures 403 and 404. The flow of plasma ions reflected down from the walls of the trenches sharpens the trench bottoms. After the complete removal of the nanomask, i.e. regions 10b, the structure shape tends to a triangular profile as in the structure 405 with a quasiperiodic array of nanoridges 24 of silicon with a sawtooth cross-section. Array period 3 coincides with the period of nanomask 1. In at least some embodiments, the height 25 of nanoridges 24 is essentially the same for all nanoridges in the array. The ratio of nanoridge height 25 to the array period 3 may be in the range, for example, from 2 to 3.

For some RIE modes it is advisable to use subsequent wet etching. FIG. 2B shows the change in shape of nanoridges by wet etching in a solution of $HNO_3$/HF=250:1 (volume ratio) after RIE. In this RIE mode, an array of nanoridges 24a with rounded tops forms as in the structure 406. The array period was of about 90 nm. Wet etching for 10 seconds removed a silicon layer about 7 nm thick and the defects that were created by RIE and led to the formation of nanoridges 24b with sharp tops and mostly the same height as in the structure 407. A change in the shape of the nanoridge cross-section is accompanied by changes in the visible color of nanostructured surface from black-blue to black.

Figure 3A:
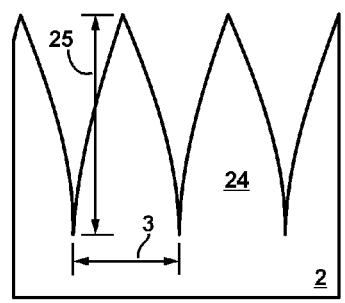
FIGS. 3A to 3B are views of possible cross-sections of silicon nanoridges in accordance with the invention.
Figure 3B:
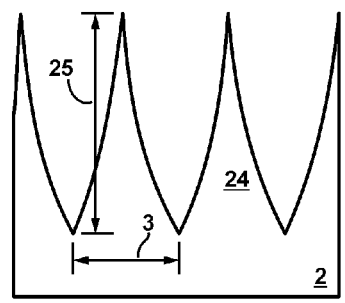

FIG. 3A shows an example of cross-sectional shape of nanoridges 24 with convex walls and FIG. 3B shows an example with concave walls. Variation of the height and shape of the nanoridges 24 is carried out by changing the modes of RIE and wet etch. Nanomasks 11 and 12 are subjected to a similar transformation as a result of RIE and wet etch.

Figure 3C:
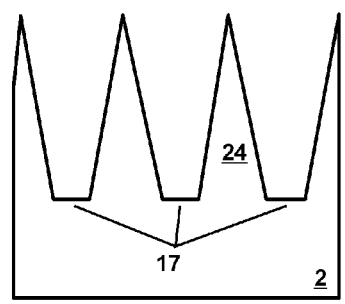
FIG. 3C is a view of an unacceptable cross-section of silicon nanoridges.

A generally undesirable cross-sectional shape of the array of nanoridges is shown in FIG. 3C with flat areas 17 of silicon surface between the nanoridges 24. Etch modes should be adjusted so that between the nanoridges 24 there are no flat areas 17, which reflect light off the wafer surface.

FIGS. 4A to 4D, 5A to 5B, 6A to 6B, and 7 show the arrays of nanoridges formed from nanomasks 1 with the same topology but with different periods. Arrays of nanoridges with average periods of 85, 53, 36, and 30 nm were obtained by RIE from nanomasks 1 with the same corresponding periods. Nanomasks were obtained by the bombardment of areas of silicon wafers by a nitrogen ion beam $N_2^+$ at angle $\theta=53°$ with energies of 5, 4, 2, and 1.5 keV, respectively. With the decreasing period of nanomask 1 the topology of the arrays of nanoridges significantly changes from the topology of regions 10 in nanomask 1 to an array of separated nanopeaks.

Figure 4A:
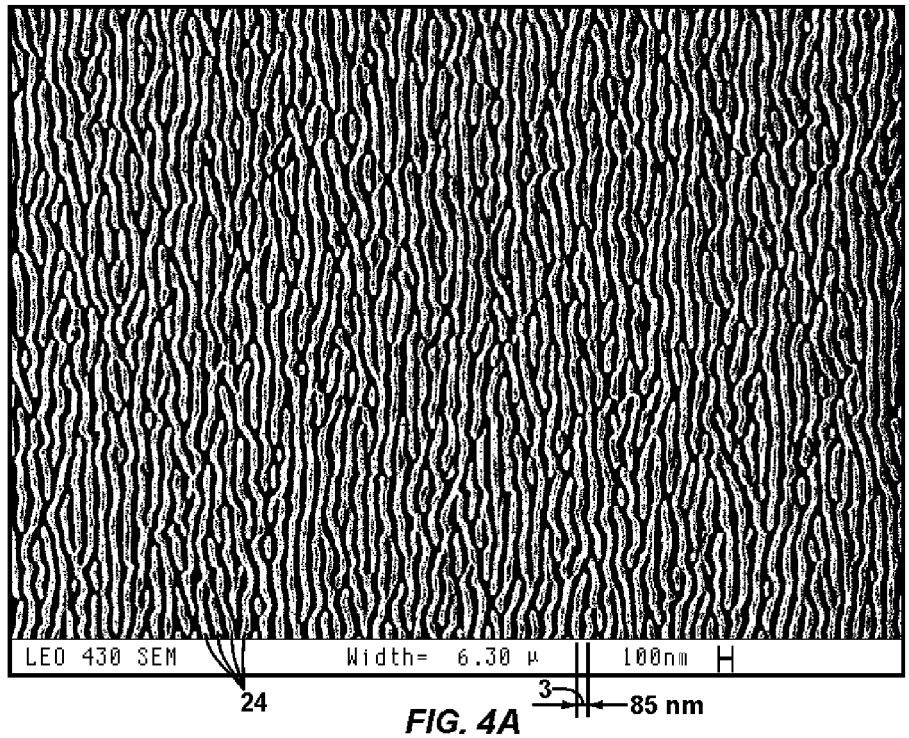
FIGS. 4A to 4D are SEM top views of quasiperiodic arrays of silicon nanoridges having sawtooth cross-section with different periods of 85, 53, 36, and 30 nm, respectively, according to the invention.

An SEM image (top view) of an array of elongated nanoridges with an average period of 85 nm is shown in FIG. 4A. The tops of the nanoridges (middles of light stripes 24) are displayed in the SEM as dark threads. This feature is related to a specific SEM instrument LEO 430, the maximum resolution of which is achieved at high energy of electrons of 30 keV. In the case of low-voltage SEM tops of the nanoridges are seen bright. From this SEM image one can see that the nanoridges are elongated in the plane of the array and substantially oriented in one direction, i.e., along the vertical edges of the image, some nanoridges connecting to the neighboring nanoridges and forming branched structures.

Figure 4B:
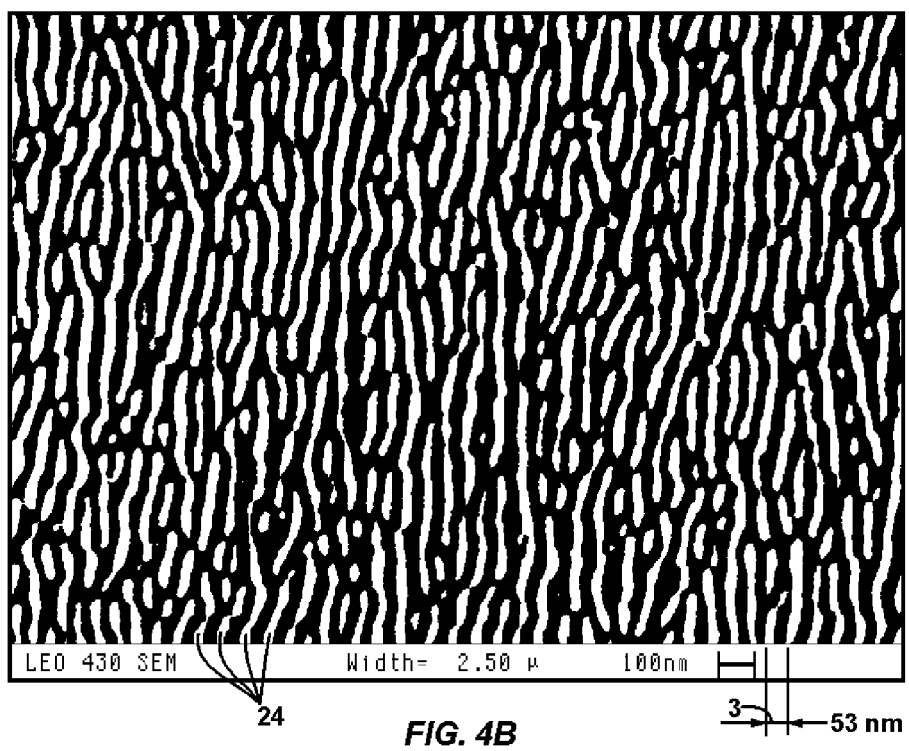

SEM image (top view) of an array of elongated nanoridges with an average period of 53 nm is given in FIG. 4B. The tops of the nanoridges 24 are shown in the SEM as white stripes. It is seen that with decreasing period the topology of the array of nanoridges changes. As in the previous case the nanoridges are elongated in the plane of the array and substantially oriented in one direction, but now the nanoridges are mostly separated from each other.

Figure 4C:
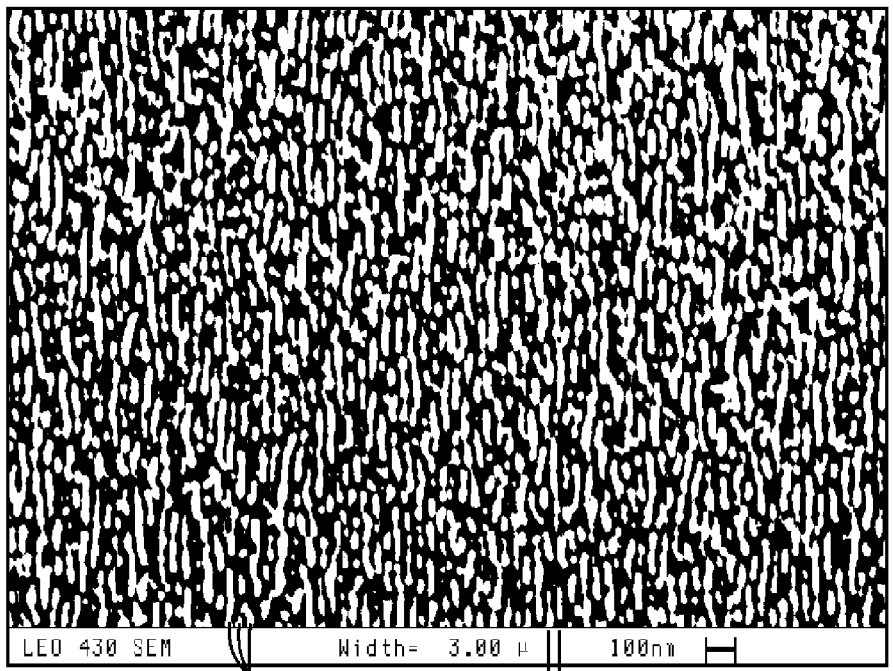

With further decrease in the period of the array of nanoridges down to 36 nm an increasing number of separated nanopeaks are observed as shown in FIG. 4C. In this case, however, the unidirectional orientation of the nanoridges is obvious, because most of them have an elongated shape.

Figure 4D:
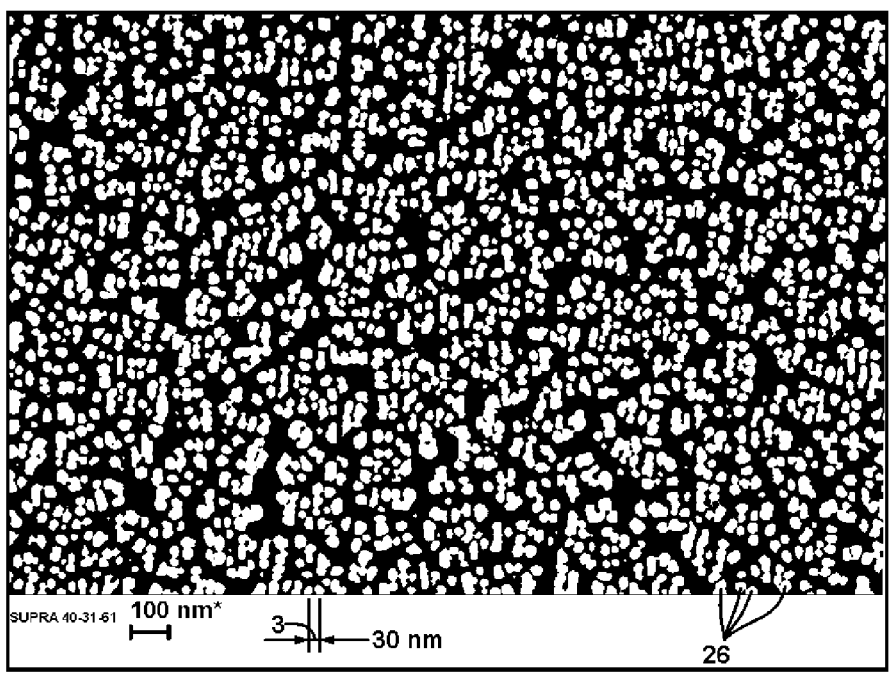

When the period of the array of nanoridges reaches 30 nm, the pattern significantly changes. Now the array mainly consists of separated nanopeaks 26, some of which are arranged as quasiperiodic rows, as shown in FIG. 4D. The arrangement of the quasiperiodic rows is determined by the pattern of regions 10 of the nanomask.

The observed change in the topology of the array of nanoridges may be caused by enhancement of relative change in thickness of region 10 in wavelike nanomask with a decrease in its period, which manifests itself in RIE modes having lower selectivity. In these RIE modes, for nanomasks with shorter periods in the range of 20 to 40 nm, the thinnest areas 4 of regions 10 are etched faster than thickest areas 5 (see, FIG. 1C), and as a result these nanomasks transform into chains or rows of separated nanopeaks. As this takes place, the size of nanopeaks reaches 10 nm, which provides the ability to activate multiple exciton generation (MEG) in silicon at room temperature, leading to increased solar cell efficiency. In RIE modes having maximal selectivity the nanomask does not transform into the array of nanopeaks. These modes result in arrays of elongated nanoridges having the topology of initial nanomask with periods in the range of 20 to 40 nm.

By lowering the selectivity of RIE etching modes it is possible to obtain quasi-periodic rows of nanopeaks in the range of nanomask periods from 20 to 150 nm (or 20 to 180 nm or 20 to 200 nm).

Figure 5A:
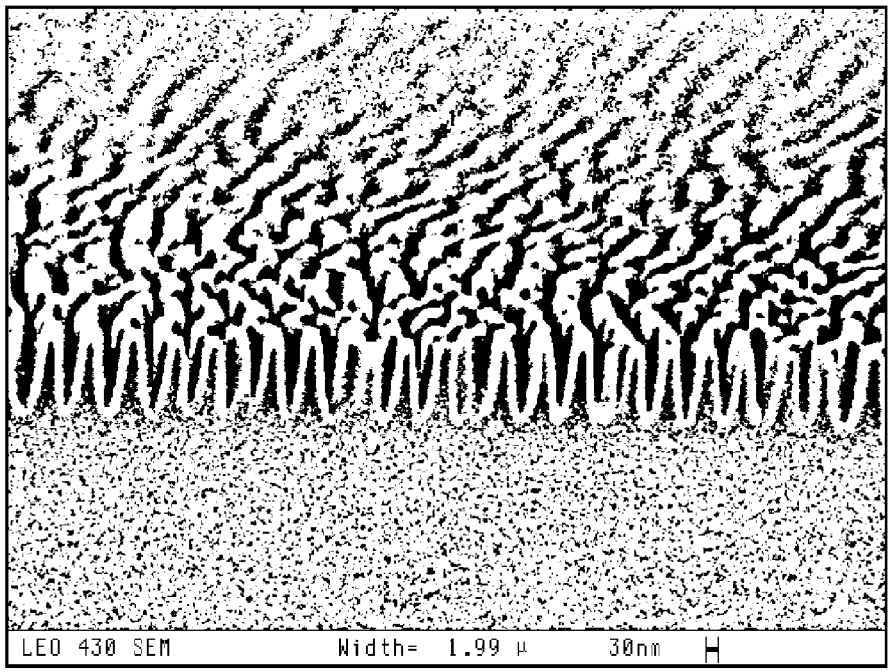
FIGS. 5A to 5B are SEM cross-section views, angled at 82°, of quasiperiodic arrays of silicon nanoridges with periods of 85 and 53 nm, respectively, according to the invention.
Figure 5B:
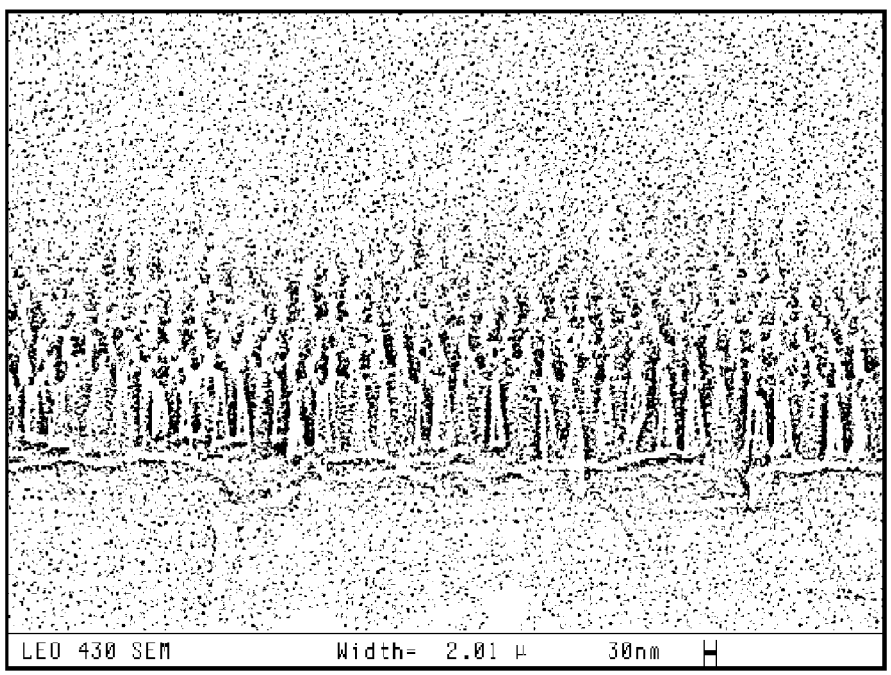

FIGS. 5A and 5B show the cleft samples of silicon wafers with quasiperiodic arrays of silicon nanoridges with periods of 85 and 53 nm and heights of the nanoridges in arrays of about 170 and 150 nm, respectively. The ratio of nanoridge height to the period of the array in FIG. 5A is close to 2 and in FIG. 5B is close to 3.

Figure 6A:
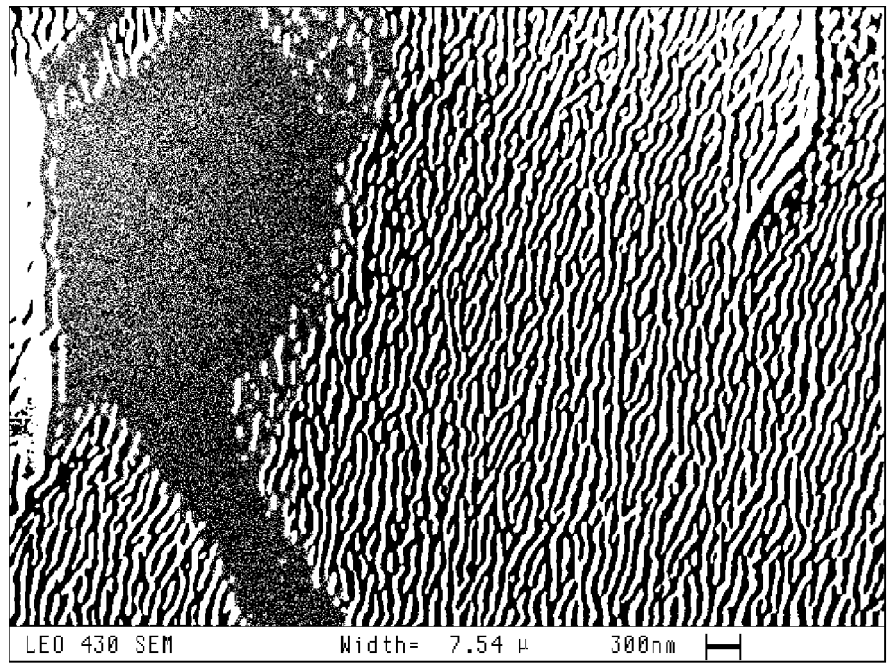
FIGS. 6A to 6B are a SEM top view and a SEM cross-section view angled at 82°, respectively, of the cleavage of monocrystalline silicon solar wafers with a nanostructured surface, according to the invention.
Figure 6B:
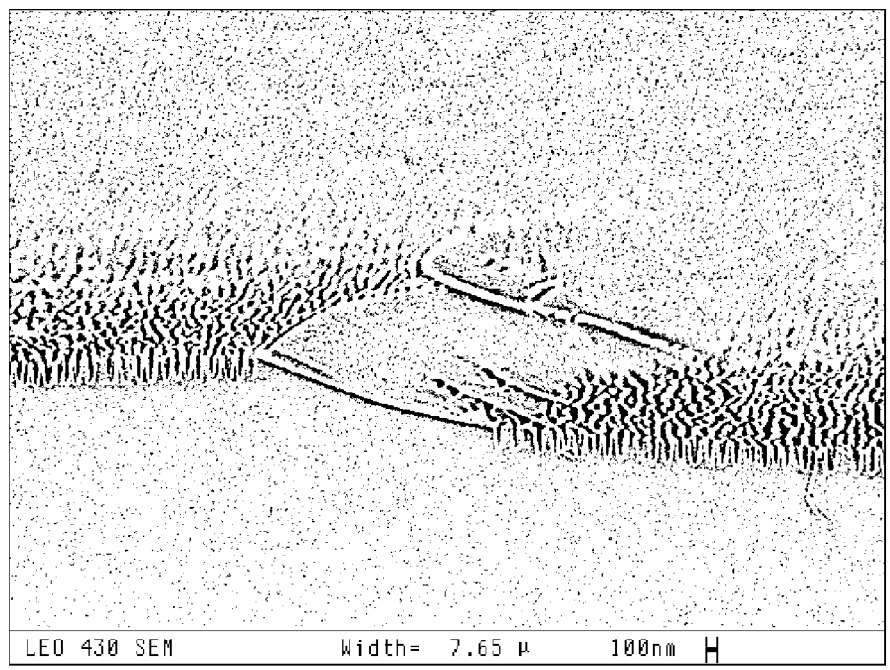

FIGS. 6A and 6B show a top view and a cleavage of a mono crystalline silicon solar wafer with quasiperiodic arrays of silicon nanoridges with periods of 85 and 100 nm, respectively. It is seen that the wafer has areas in which there are no nanoridges.

Figure 6C:
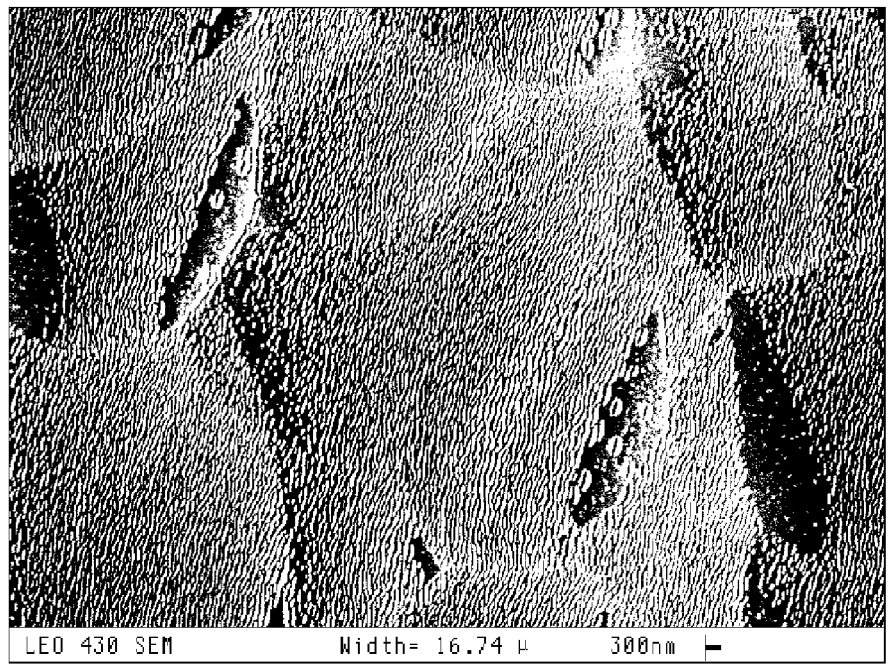
FIGS. 6C to 6D are a SEM top view and a SEM cross-section view angled at 82°, respectively, of the cleavage of polycrystalline silicon solar wafers with a nanostructured surface, respectively, according to the invention.
Figure 6D:
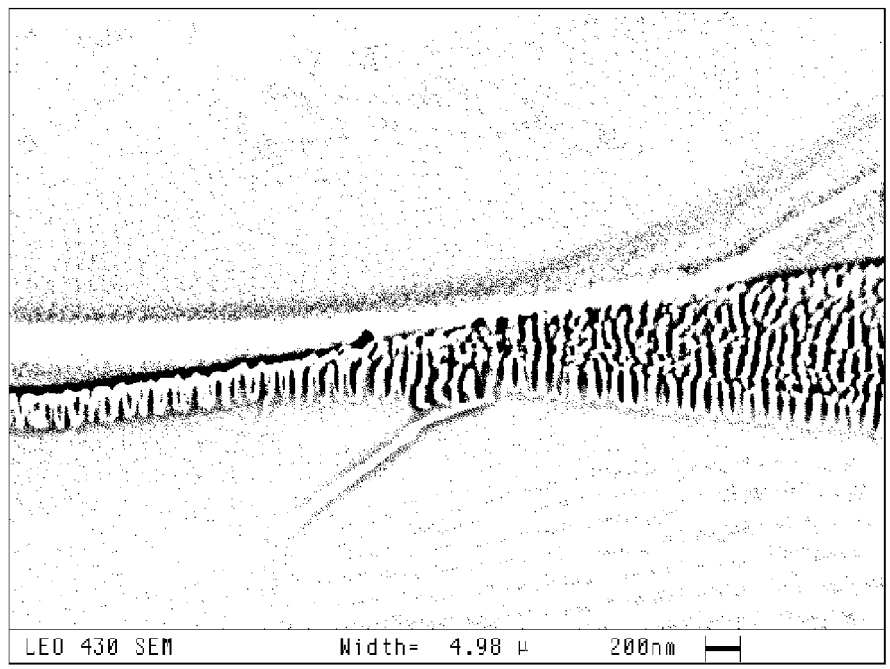

FIGS. 6C and 6D show a top view and a cleavage of a polycrystalline silicon solar wafer with quasiperiodic arrays of silicon nanoridges with periods of 70 and 95 nm, respectively. It is also seen that the wafer has areas in which there are no nanoridges.

Figure 7:
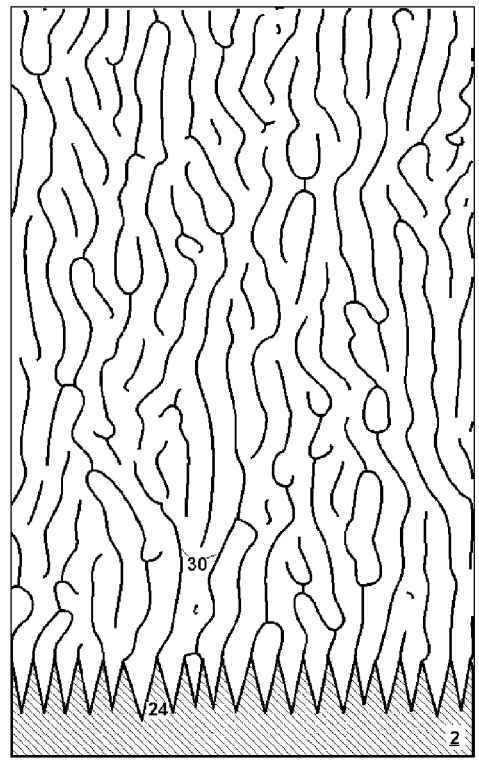
FIG. 7 is perspective view angled at 60° of a quasiperiodic array of silicon nanoridges with a period of 85 nm having a sawtooth cross-section highlighted by hatching, according to the invention.

FIG. 7 was obtained on the basis of the SEM images presented in FIGS. 4A and 5A. The period of the array of nanoridges 24 is 85 nm and the height of the nanoridges is of about 170 nm. The tops of the nanoridges are shown by curves 30 for a visual representation of the topology of quasiperiodic array of silicon nanoridges with a sawtooth cross-section. The heights of the nanoridges in the array are mostly the same as shown in FIGS. 5, 6B, 6D and 7.

Figure 8A:
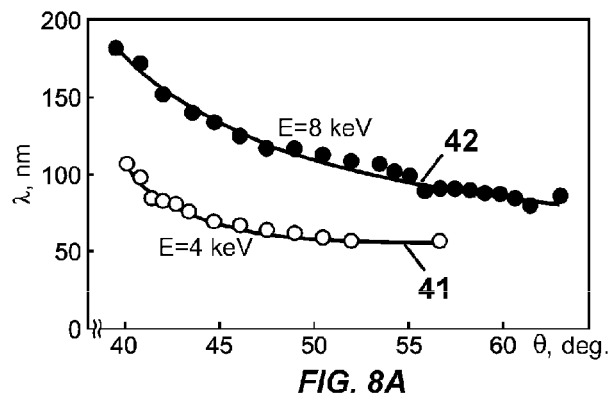
FIGS. 8A to 8B are graphs of nanomask period λ and nanomask formation depth $D_F$ in silicon on ion incidence angle θ measured from silicon surface normal, according to the invention.
Figure 8B:
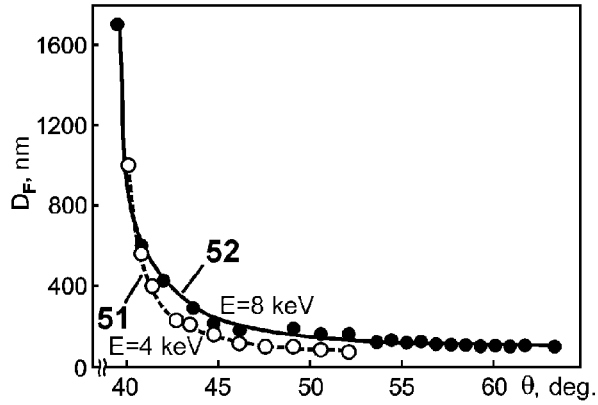

The angular dependences shown in FIGS. 8A and 8B demonstrate the formation of a wavelike nanomask on curved surfaces of silicon solar wafers and the degree of coverage by the nanomask and, accordingly, by the array of nanoridges. As follows from the lines 51 and 52 obtained for the energies of ions $N_2^+$ of 4 and 8 keV, respectively, the depth of nanomask formation $D_F$ depends weakly on the angle of ion bombardment $\theta$ (measured from the local surface normal) in the range of $\theta$ from 43° to 65°. Nanomask period $\lambda$ also varies little in the specified range of angles $\theta$ as can be seen from the lines 41 and 42. Therefore, when selecting an angle $\theta$ in the range 53°-55° relative to the mean normal to the surface of the wafer, tolerances of ±10° of local normals are typically acceptable and do not lead to nanomask discontinuities. Thus 100% of the surface with such a local variation of the angles is likely to be covered by the nanomask. From the above it follows that the divergence of the ion beam of ±5° typical for industrial ion sources is allowable as well.

However, if the surface has developed topography, then some areas are irradiated by ions at grazing angles $\theta$>70° or at angles close to normal $\theta$<40°. On these areas a nanomask is often not formed. By composition and thickness these areas are close to regions 20 and 10, respectively. FIG. 6A shows a bare area on a wafer surface irradiated by nitrogen ions at an angle $\theta$>70° relative its local normal, and FIG. 6B shows a bare area on a wafer surface irradiated by nitrogen ions at angle $\theta$<40°. On these bare areas, the nanomask was not formed and, accordingly, an array of nanoridges was not produced as a result of RIE.

Under simultaneous bombardment of different areas of a solar cell silicon wafer with different local normals by nitrogen ions a wavelike nanomask is not necessarily formed on them simultaneously. First, a nanomask arises on the surface areas bombarded at larger angles $\theta$, and then on areas bombarded at smaller angles $\theta$. In the process of nanomask formation low-amplitude waves appear at the ion sputtering depth $D_m$. These low-amplitude waves can be observed in SEM. The waves having lower amplitude at the sputtering depth, which is less than $D_m$, are difficult to view in SEM. Then during ion sputtering wave amplitude increases and reaches saturation at the sputtering depth $D_F$ ($D_F \approx 1.5 D_m \approx \lambda$ for $\theta$=43°-63°. Angular dependences of $D_F$ are shown in FIG. 8B. Depending on the bombardment angles the depths $D_F$ correspond to the following doses of $N_2^+$ ions: $\theta$=43°-3.2× $10^{17}$ cm$^{-2}$, $\theta$=53°-1.1×$10^{17}$ cm$^{-2}$, $\theta$=63°-0.8×$10^{17}$ cm$^{-2}$. Therefore, for the broad ion beam on different wafer areas there are nanomasks at different stages of their formation. During the bombardment of the wafer at the average angle $\theta$=53° with an average dose of 2×$10^{17}$ cm$^{-2}$ on areas with a local angle $\theta$=53° the nanomask 1 forms at a depth of about 1.8$D_F$, on areas with $\theta$=43° the nanomask 12 forms at a depth of about 0.6$D_F$, and on areas with a local angle $\theta$=63° the nanomask 11 forms at a depth of about 2.5$D_F$. Thus, the nanomask 11 is subjected to ion sputtering for the longest time after its formation, i.e., after the saturation of wave growth and the nanomask 12 yet remains at the stage of wave growth. Nanomask 1 with grown-up waves has intermediate status. Ion sputtering mostly affects nanomask 11, in which the intensive sputtering of wave breaks 19 (see FIG. 1G) leads to a significant increase in the average period $\lambda$ of the nanomask compared to that of dependences in FIG. 8A. The period of nanomask 11 does not change at sputtering depths≤$D_F$ and is consistent with angular dependences in FIG. 8A. When the sputtering depth increases further the period of nanomask 11 increases substantially in comparison to the values of FIG. 8A due to more intense ion sputtering at angles $\theta$=60°-65° in comparison to the angles $\theta$=42°-55° for nanomasks 1 and 12. Periods $\lambda$ of nanomasks 1 and 12 do not change for sputtering depths≤3$D_F$ and are consistent with angular dependences in FIG. 8A. When the sputtering depth increases further these periods begin to exceed the values of FIG. 8A.

In at least some embodiments, wavelike nanomasks are formed at an ion dose in the range 5×$10^{16}$-5×$10^{17}$ cm$^{-2}$ for a $N_2^+$ ion beam. This dose range corresponds both to the nanomasks having small amplitude waves at depths $D_m$ and to nanomasks having grown (saturated) amplitude of waves at sputtering depths>$D_F$. For a $N_2^+$ ion beam the range of ion dose 1×$10^{17}$-5×$10^{17}$ cm$^{-2}$ corresponds to the nanomasks having grown waves at depths>$D_F$.

Figure 9A:
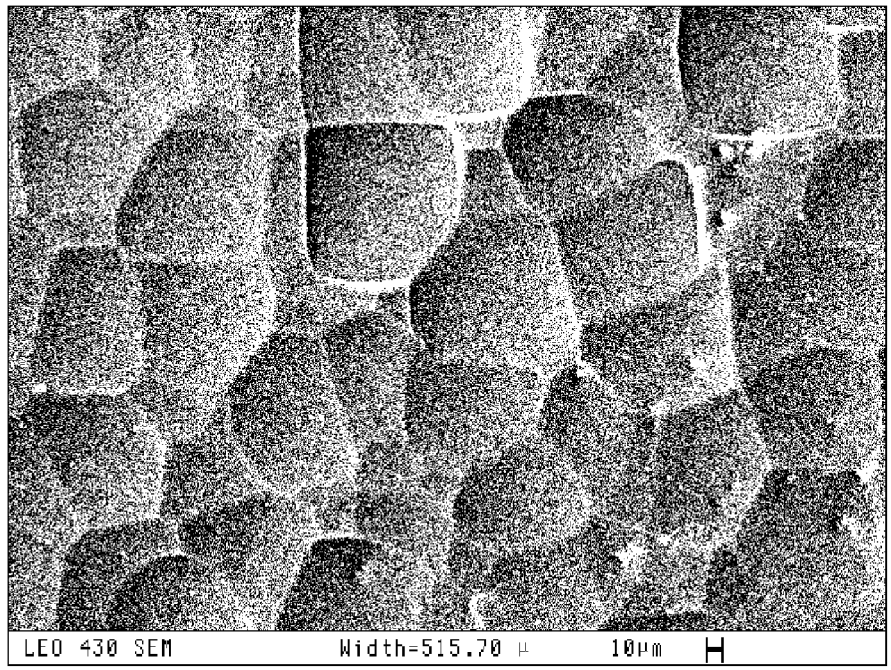
FIGS. 9A to 9B are SEM top views of a wavelike nanomask formed using a $N_2^+$ ion beam at E=5 keV, θ=53° and covering about 100% of the surface of a monocrystalline silicon solar wafer using low and high magnification, respectively, according to the invention.
Figure 9B:
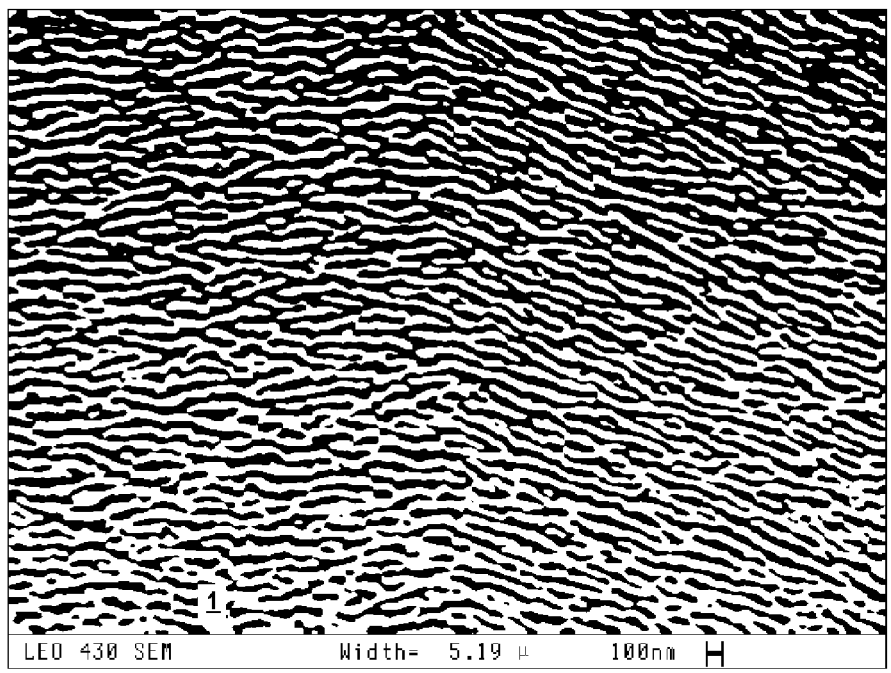

On a wafer of solar cell monocrystalline silicon with the topography shown in FIG. 9A the average size of the dish-shaped areas is of about 60 μm, and the local normals on these concave areas vary smoothly within ±10°. Therefore, for such a wafer the degree of surface coverage by a wavelike nanomask reaches nearly 100% for the bombardment of the wafer at $\theta$=53° with respect to its average surface normal. FIG. 9B shows the image of the surface of the same wafer with the magnification enough to observe a wavelike nanomask 1. The waves are oriented differently for the left and right parts of FIG. 9B. This is because these areas of the surface correspond to different local planes, which intersect in the ridge in the middle of the image, and, accordingly, the directions of projection of the ion flux at these areas were different.

Figure 10A:
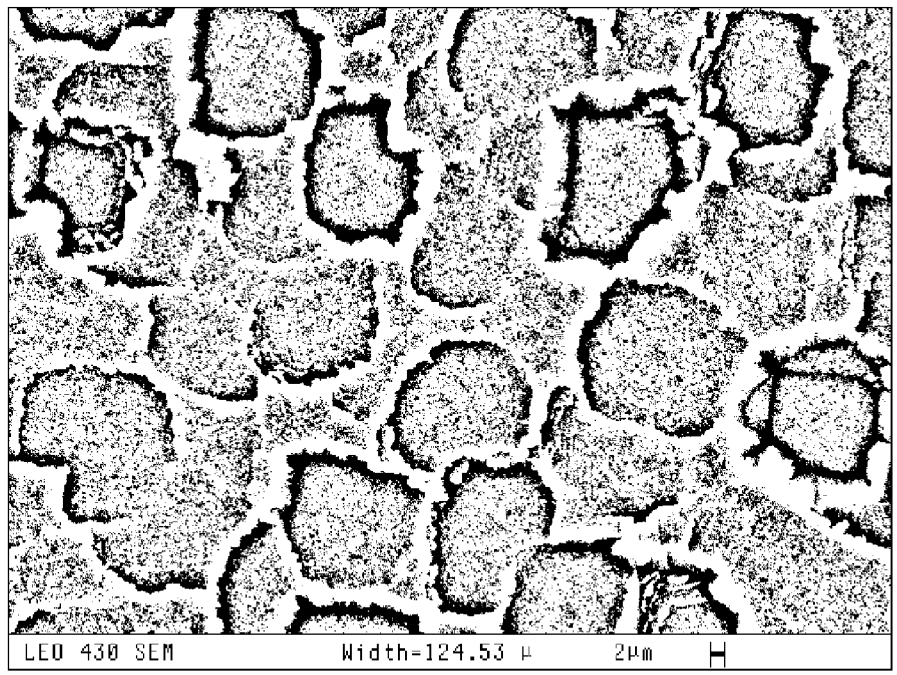
FIGS. 10A to 10B are SEM top views of a wavelike nanomask formed using a $N_2^+$ ion beam at E=5 keV, θ=53° and covering more than 90% of the surface of a monocrystalline silicon solar wafer using low and high magnification, respectively, according to the invention.
Figure 10B:
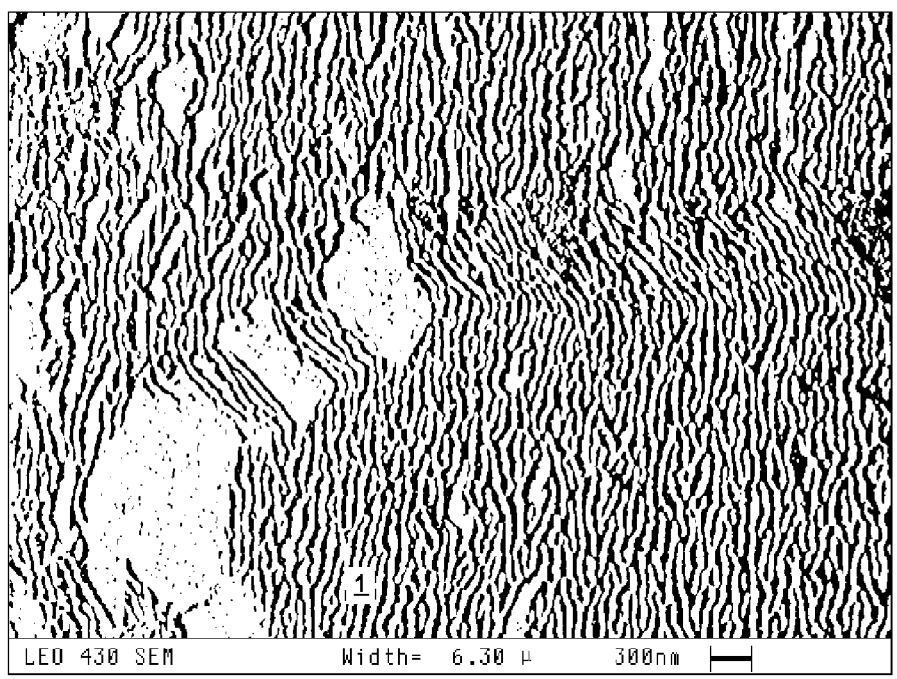

FIG. 10A shows a portion of the surface of a monocrystalline silicon wafer with a terrace-shaped topography in the form of etch pits with an average size of about 20 μm. On the surface of the terraces the local normals vary weakly, but on the borders of the terraces and on the walls of the etch pits there can be abrupt changes up to ±37°. Therefore, the choice of the angle of wafer bombardment θ=53° with respect to the wafer plane normal in this case is optimal, because the walls of the pits do not shade their bottom from the ion beam, thus giving the maximum degree of coverage of the wafer surface by nanomask. FIG. 10B shows the image of the surface of the same wafer with the magnification enough to observe a wavelike nanomask 1. It is seen that nanomask waves sharply change direction at the walls of an etch pit, and on bare areas where θ=0°-40° nanomask does not exist. The degree of surface coverage by wavelike nanomask for this portion of surface is more than 90%.

Figure 11A:
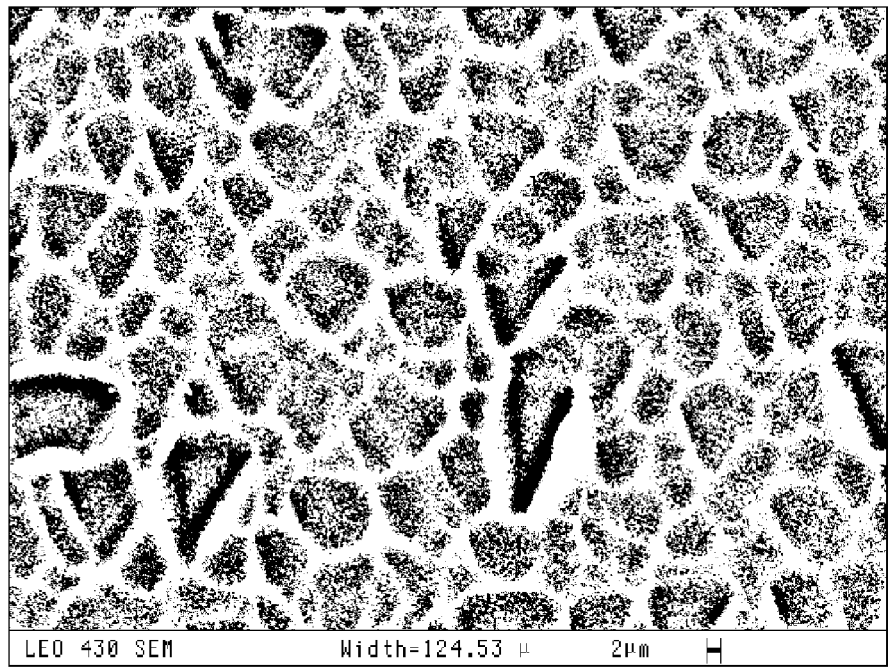
FIGS. 11A to 11D are SEM top views of a wavelike nanomask formed by $N_2^+$ ions at E=5 keV, θ=53°, according to the invention.
Figure 11B:
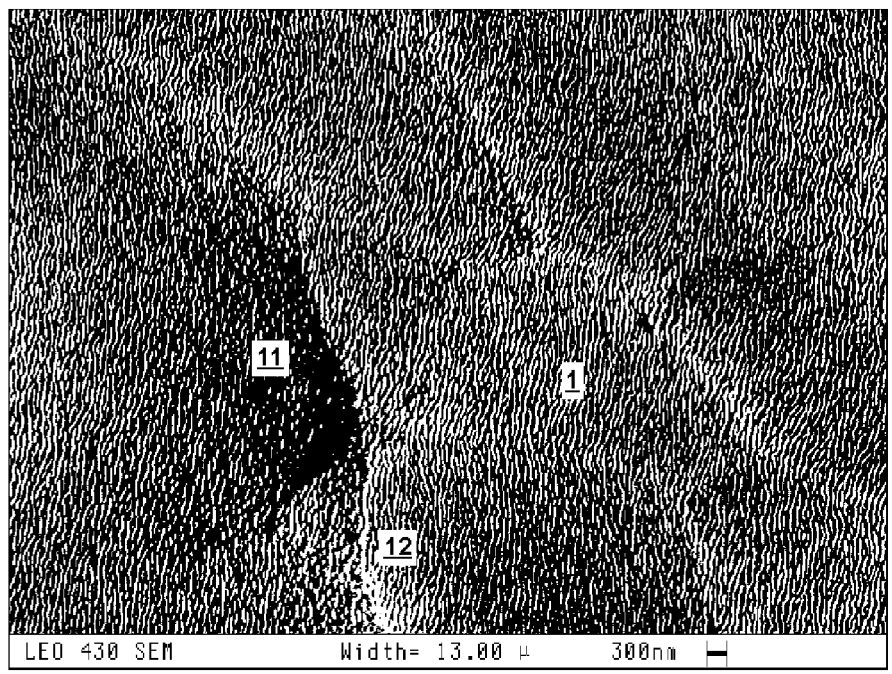

FIG. 11A shows a portion of the surface of polycrystalline silicon wafer. Average size of the dish-shaped areas is of about 5 μm. The local normal on these concave areas varies smoothly within ±13°. Therefore, for such a wafer the degree of surface coverage by a wavelike nanomask reaches nearly 100% for the bombardment of the wafer at θ=53°. FIG. 11B shows a magnified image of the surface of the same wafer with a wavelike nanomask. Nanomasks with different topologies 1, 11, and 12 are shown on the surface of dish-shaped areas separated by ridges. The wavelength (period) of the nanomask changes over the surface in accordance with the angular dependence presented in FIG. 8A with allowance made for increased periods of the nanomask 11. A nitrogen ion beam was directed right to left for nanomasks in FIGS. 11A to 11F. The waves of wavelike nanomasks are substantially oriented in one direction along the vertical borders of images in FIGS. 11B, and 11D to 11F.

Figure 11C:
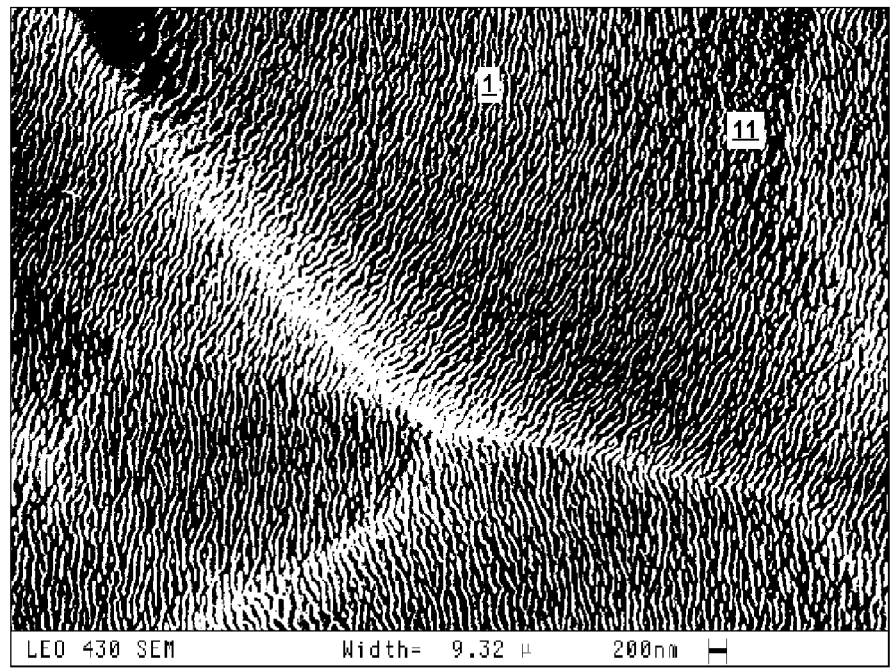

FIG. 11C shows a magnified image of a wavelike nanomask with topologies 1 and 11 on the surface of a polysilicon wafer. One can see the large-scale ridges separating the dish-shaped areas of the surface with a nanomask. The directions of waves in arrays correspond to the directions of local projections of the ion flow on the surface areas.

Figure 11D:
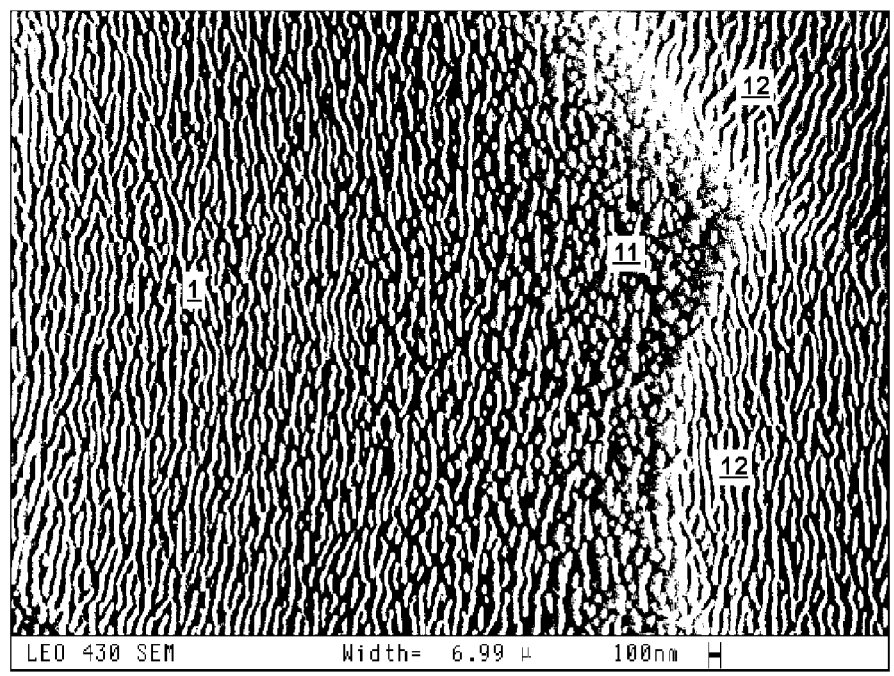

FIG. 11D further shows an image of a wavelike nanomask on the surface of a polysilicon wafer with all types of topologies 1, 11, and 12.

Figure 11E:
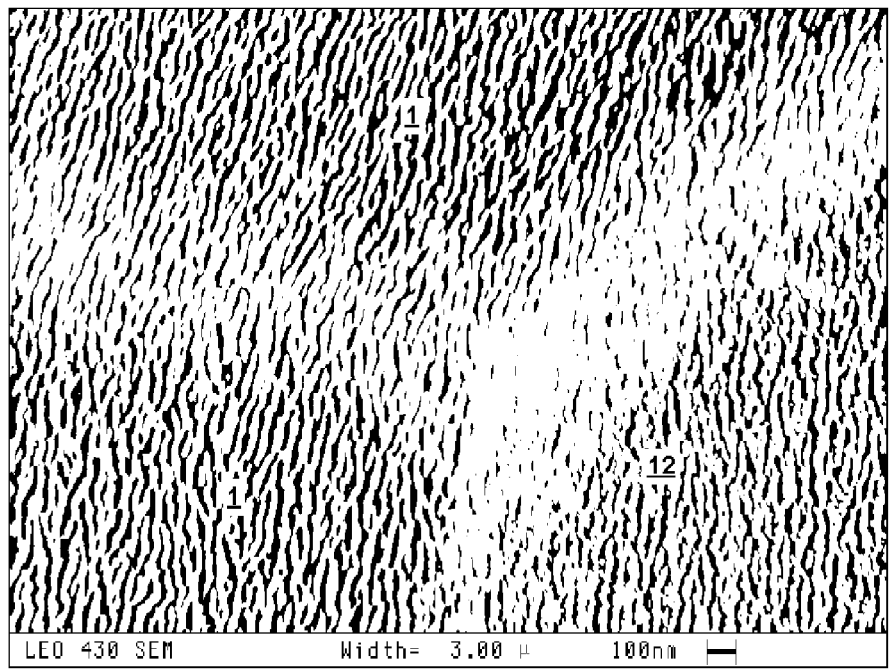
FIGS. 11E to 11F are SEM top views of a wavelike nanomask formed by $N_2^+$ ions at E=2 keV, θ=53°, according to the invention.
Figure 11F:
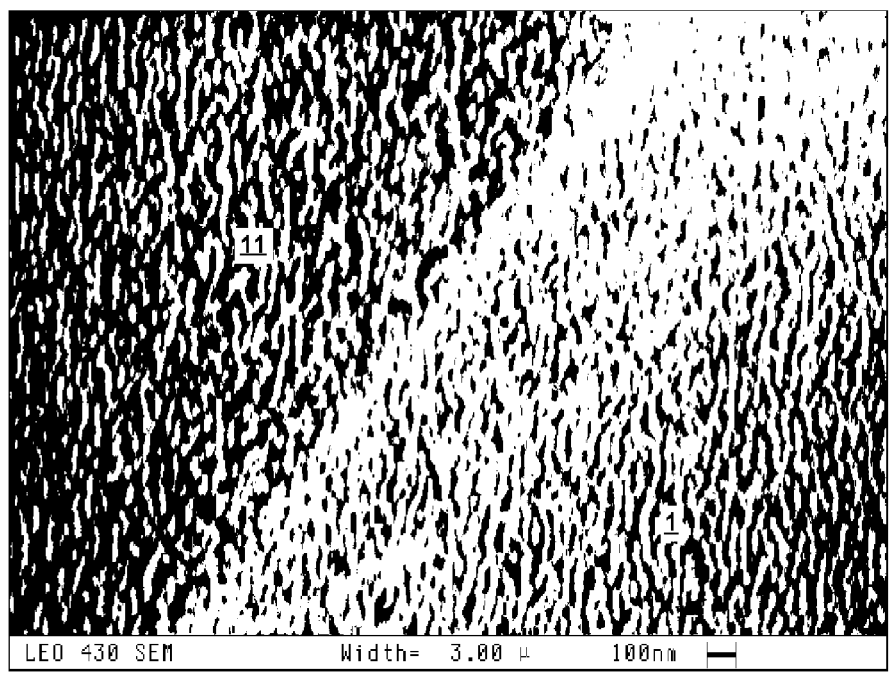

FIGS. 11E to 11F show images of a wavelike nanomask on a surface of a polysilicon wafer obtained at lower energy of ions $N_2^+$. A comparison of FIGS. 11B to 11D with FIGS. 11E to 11F shows that the nanomask period decreases with decreasing ion energy from 5 to 2 keV. FIG. 11E shows an area of a nanomask with topologies 1 and 12, and FIG. 11F shows an area of a nanomask with topologies 1 and 11. Also large-scale ridges obviously manifest at the boundaries of dish-shaped areas of the wafer.

Figure 12A:
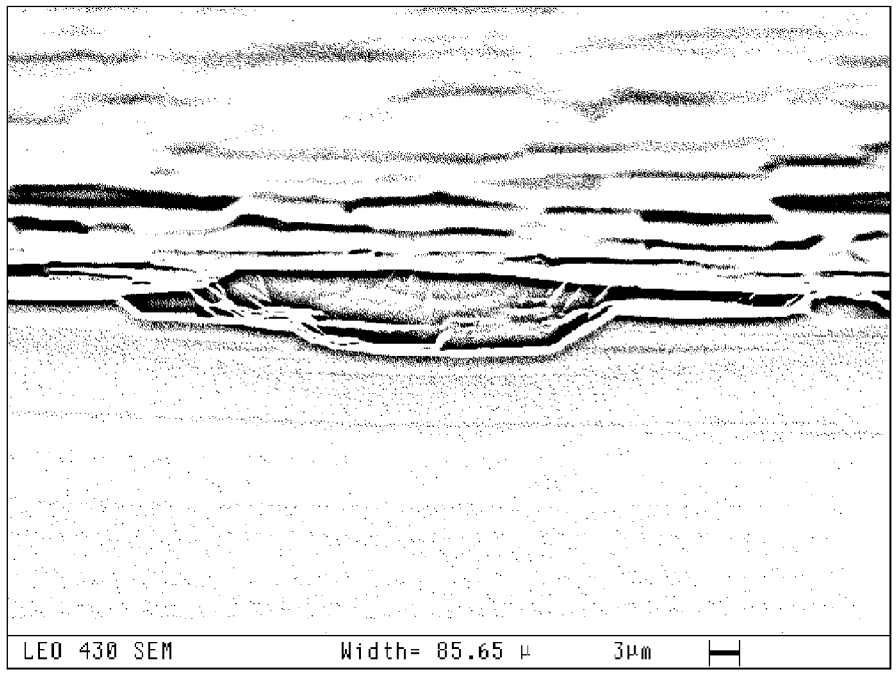
FIGS. 12A to 12B are SEM cross-section views, angled at 82°, of solar wafers of mono- and poly-silicon, respectively, according to the invention.
Figure 12B:
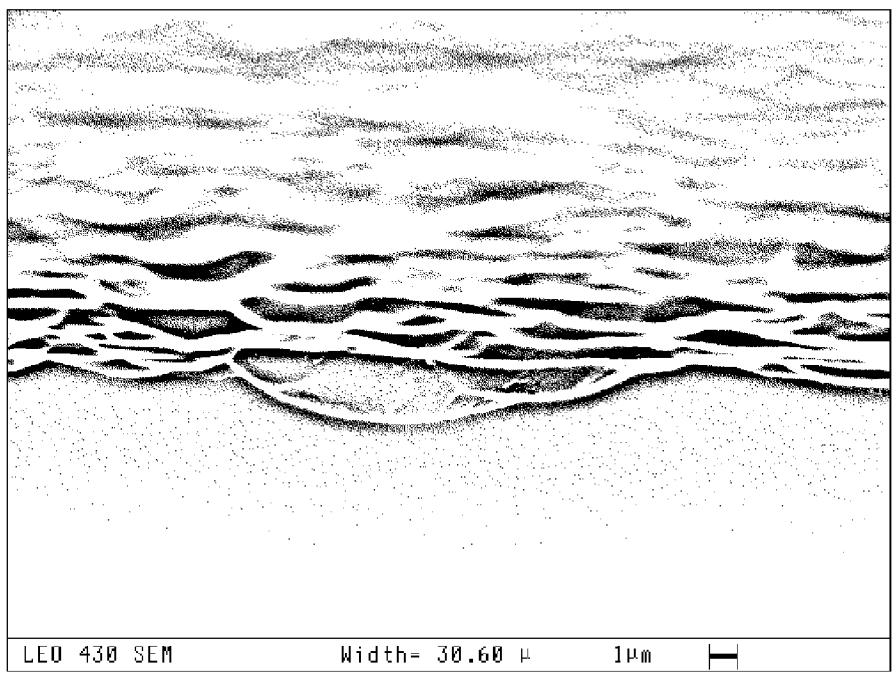

Cleft wafers of mono- and poly-silicon with a wavelike nanomask are shown in FIGS. 12A and 12B, respectively. The angles of inclination of the walls of the terraces on monocrystalline silicon are on average no more than 37°, so the irradiation of the wafer by nitrogen ion beam at an angle of 53° relative to the mean normal to its surface is optimal for maximum surface coverage by nanomask. Deviations of local normals for most areas on the surface of polycrystalline silicon wafer are within ±13° from the mean normal, which provides close to 100% coverage of the wafer surface by a nanomask.

The measured reflection coefficient of non-polarized light from the surface of a monocrystalline silicon wafer with an array of nanoridges with a period of 85 nm and a height of about 170 nm is less than 2% over the entire range of wavelengths of light from 400 to 900 nm. A nanostructured silicon surface with extremely low light reflectivity looks black even at bright light and can be termed "black silicon." In at least some embodiments, the reflection coefficient of the nanostructured surface is no more than 5%, 4%, 3%, or 2% over the range of light wavelengths from 400 to 900 nm.

It is preferable to control the process of black silicon formation by the intensity of light reflecting from the wafer surface and to terminate it at the instant the reflectivity reaches a desired predetermined value. Such methods and devices are known and modern RIE systems are equipped with optical sensors for determining the moment to stop etching.

It is important to note that at grazing incidence angles the nanostructure with an array of nanoridges shows a significantly greater light absorption, when the light directed along the nanoridges is compared to that directed perpendicular to the nanoridges. Therefore, it is reasonable to arrange photovoltaic solar cells in photovoltaic modules with the same orientation of nanoridges and to orientate the photovoltaic modules with respect to the east and west points of the horizon so that the nanoridges are mostly positioned along the east-west line. This allows one to improve the efficiency of the modules during the time periods when the sun is low in the sky.

Silicon wafers are often made by cutting a silicon ingot into wafers with a wire saw. Preferably, the wafer is chemically polished to remove a saw-damaged layer from its surface. This operation can be carried out by known methods, including those using alkaline or acid etchants. In at least some embodiments, prior to the formation of a nanomask the saw-damaged layers are removed from the surfaces of wafers in acid polishing solutions. In at least some embodiments, the deviations of the local normals of the wafer areas are within ±10° from the mean normal. The wafers manufactured by edge-defined film-fed growth (EFG) from molten silicon do not comprise the saw damaged layer and its removal is not required for these wafers.

Figure 13A:
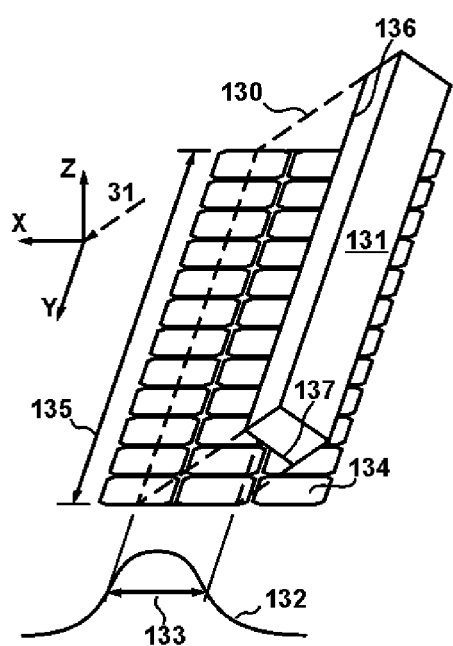
FIG. 13A to 13B are perspective views of linear ion beams irradiating moving silicon solar wafers, according to the invention.

In at least some embodiments, it is preferable to form a nanomask on the surface of silicon solar wafers by linear ion beam of large size. This equipment is produced, for example, by a German company Roth & Rau AG. Dimensions of the ion beam can be, for example, in the range of 400×120 to 2000×120 mm²; the energy of ions, up to 2 keV; ion current density, 1 mA/cm². In at least some embodiments, it is preferable to carry out the irradiation of wafers 134 arranged in rows on a moving carrier under a fixed ion beam 130 as shown in FIG. 13A. In this case, the long side 136 of the aperture of the ion source 131 is positioned parallel to the XY-plane of wafers and along the Y-axis, i.e. perpendicular to the direction of wafers motion along the X-axis. The short side 137 of the aperture of the ion source 131 is positioned obliquely relative to the XY-plane, so as the ion beam 130 is directed along the arrow 31 in the XZ-plane. Wafers during the ion irradiation can be moved in the direction of the X-axis or in the opposite direction. In a particular example, a row of 12 wafers 156× 156 mm² is located along the Y-axis (i.e. along the first direction) and respectively along the ion source 131. The length 135 of the row is equal to the size of the long side 136 of the ion source aperture.

In at least some embodiments, the velocity of wafer translation (V, cm/s) is determined by the dose of ion irradiation and is calculated by formula: V=J×L/D, where J is flux of ions in the XY-plane of the wafers surface, $cm^{-2}s^{-1}$; (L, cm) is the size 133 of the ion beam at half maximum intensity in the XY-plane of the wafers surface in the direction of motion along the X-axis; (D, cm$^{-2}$) is the ion dose to form the nanomask. The intensity 132 of the ion beam in the XY-plane does not need to be uniform in the direction of wafer translation along the X-axis. The beam uniformity is necessary only in the direction of the Y-axis. Thus, the ion beam 130 is formed by the linear ion source 131, which is elongated parallel to the wafers surface and perpendicular to the direction of their movement.

In one example, the ion current density of 1 mA/cm$^2$ at the exit of the ion source aperture corresponds to J=3.8×10$^{15}$ cm$^{-2}$s$^{-1}$ in the XY-plane at θ=53°. For L=20 cm, D=2×10$^{17}$ cm$^{-2}$ V=4 mm/s, which can provide the throughput of 1000 wafers 156×156 mm$^2$ per hour for a single ion source 2 m long with a continuous feed of wafers.

Figure 13B:
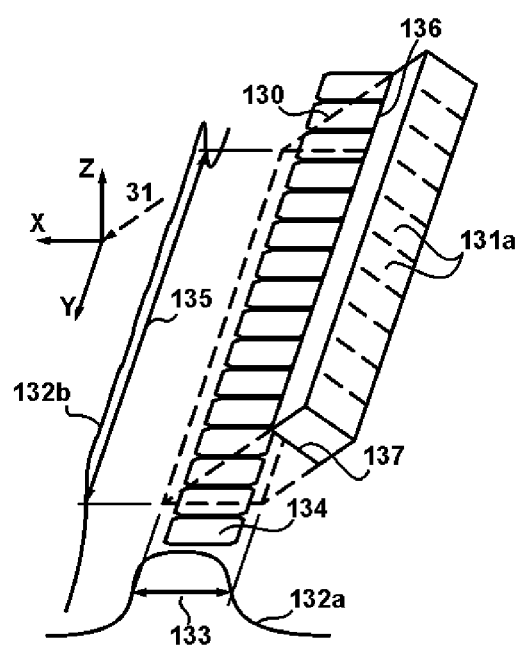

In at least some embodiments, the linear ion source is composed from modules 131a as shown in FIG. 13B. The intensity 132b of the ion beam in XY-plane is less uniform along the Y-axis than its intensity 132a along the X-axis. The wafers move along the Y-axis in the first direction, i.e. perpendicular to the ion beam projection to the wafer surface. This provides a more compact design of the vacuum system and the same throughput as in previous example.

High productivity RIE and wet etching tools are also used by industry, for example, for the production of solar cells and liquid crystal displays.

Silicon photovoltaic solar cell, comprising silicon solar wafer of p-type conductivity with nanostructured surface, after the step of nanostructuring the wafer surface can be made using known manufacturing steps such as, for example, depositing the source of dopant in the form of phosphorus silicate glass (PSG) film onto the nanostructured wafer surface and forming a diffusion p-n junction. Manufacturing processes may include high temperature wafer heating with the diffusion of phosphorus dopant from the PSG film into the near surface region of the wafer, removing the PSG film from the nanostructured wafer surface, passivating the nanostructured wafer surface, printing and firing contacts, and isolating the wafer edges. The deposition of an antireflection layer such as silicon nitride is generally not required. The passivation of the nanostructured silicon surface can be carried out by known methods, for example, by growing a thin layer of silicon oxide a few nanometers thick, by depositing a thin hydrogenated silicon nitride layer or by depositing a thin layer of aluminum oxide. The step of contact firing should be selected for the given passivation layer.

A layer of transparent conductive oxide (TCO), for example, zinc oxide, tin oxide, or indium tin oxide (ITO) or any combination thereof, can be used as a transparent contact to the nanostructured surface onto which a grid of metal electrodes is placed as is performed in manufacturing of conventional amorphous silicon/monocrystalline silicon heterojunction solar cells. In case of the array of elongated nanoridges on the wafer surface and a ITO layer, which is sufficient to fill the spaces between the nanoridges (to planarize the nanostructure) and to form a thin layer above the nanoridges' tops, the conductivity of the ITO layer in the direction along the nanoridges is higher than that in the direction perpendicular to the nanoridges. Therefore, it is preferable that in the solar cell, which comprises a wafer with the array of nanoridges, the grid of metal conductors (wires) on an ITO layer is aligned so that the metal conductors are positioned substantially perpendicular to the nanoridges.

The fact that a nanomask with a period of λ=36 nm is formed at a depth of $D_F$ less than 100 nm from the initial silicon surface and the amplitude of the nanostructure after RIE is less than 150 nm allows nanostructuring the wafer surface of a solar cell after forming a diffusion p-n junction. In this case the process of forming the nanostructure removes a diffusion induced dead layer with defects from the wafer surface, thus improving the quality of the surface layer of silicon and increasing the efficiency of solar cells.

The diffusion process can be also carried out after the step of hard nanomask formation and before the RIE step. In this case far less silicon is removed for the nanostructure formation and shallower p-n junction is possible. For manufacturing symmetrical bifacial solar cells it is possible to implement simultaneous diffusion processes for forming emitter and back surface field layers as known in the art. The diffusion processes can be carried out after the nanostructure generation on both wafer sides, or after the nanomask formation on both wafer sides and before the RIE step, or before the nanomask formation. Thus, solar cells comprising a wafer with nanostructured surface in accordance with the present invention can be fabricated in different ways.

The above specification, examples and data provide a description of the manufacture and use of the composition of the invention. Since many embodiments of the invention can be made without departing from the spirit and scope of the invention, the invention also resides in the claims hereinafter appended.

What is claimed as new and desired to be protected by Letters Patent of the United States is:

1. A semiconductor device, comprising:
    a silicon base region; and
    a doped layer disposed on the silicon base region, herein the doped layer comprises silicon doped with a first dopant of a first conductivity type, the doped layer further comprising a nanostructured surface opposite the base, the nanostructured surface comprising a quasi-periodic, anisotropic array of elongated ridge elements having a wave-ordered structure pattern, each ridge element having a wavelike cross-section and oriented substantially in a first direction wherein a ratio of average height of the ridge elements and average period of the array is in a range from 2 to 3.

2. The semiconductor device of claim 1, wherein the silicon base region is doped with a second dopant of a second conductivity type different from the first conductivity type.

3. The semiconductor device of claim 2, wherein the first conductivity type is n-type.

4. The semiconductor device of claim 1, wherein a junction between the doped layer and the silicon base layer is not nanostructured.

5. The semiconductor device of claim 1, wherein the doped layer has a thickness of no more than 10 nm.

6. A method of making the semiconductor device of claim 1, the method comprising:
    irradiating a surface of a wafer with an oblique beam of nitrogen ions to form a nanomask, the nanomask comprising a quasi-periodic, anisotropic array of elongated elements having a wave-ordered structure pattern and a wave-like cross-section with wave crests that are substantially perpendicular to a plane of incidence of the nitrogen ions;
    etching the surface of the wafer with the nanomask to generate a nanostructured surface corresponding to the nanomask; and
    forming the doped layer in the wafer, the doped layer comprising the nanostructured surface.

7. The method of claim 6, wherein forming the doped layer comprises doping a portion of the wafer prior to irradiating the surface of the wafer with the oblique beam of nitrogen ions.

8. The method of claim 6, wherein forming the doped layer comprises doping a portion of the wafer after generating the nanostructured surface.

9. The method of claim 6, wherein forming the doped layer comprises doping a portion of the wafer after forming the nanomask and prior to generating the nanostructured surface.

10. The method of claim 6, wherein etching the surface of the wafer comprises removing the nanomask.

11. The method of claim 6, further comprising etching a saw damaged layer of the wafer.

12. The method of claim 6, further comprising moving the wafer during irradiation of the surface of the wafer with the oblique beam of nitrogen ions.

13. The semiconductor device of claim 1, wherein an average period of the array is in a range from 20 to 200 nm.

14. The semiconductor device of claim 1, wherein each ridge element has a width near its peak of no more than 10 nm.

15. The semiconductor device of claim 1, wherein a reflection coefficient of the nanostructured surface is no more than 5% over a range of light wavelengths from 400 to 900 nm.

16. The semiconductor device of claim 1, wherein a reflection coefficient of the nanostructured surface is no more than 2% over a range of light wavelengths from 400 to 900 nm.

17. The semiconductor device of claim 1, wherein the semiconductor device is a solar cell.

18. The semiconductor device of claim 17, wherein the doped layer is an emitter layer or a front surface field layer or a back surface field layer.

19. The semiconductor device of claim 17, wherein the doped layer comprises a flat surface adjacent the silicon base region.

20. The semiconductor device of claim 17, further comprising a passivation layer disposed over at least a portion of the nanostructured surface of the doped layer.

21. The semiconductor device of claim 17, wherein a reflection coefficient of the nanostructured surface is no more than 5% over the range of light wavelengths from 400 to 900 nm.

22. The semiconductor device of claim 17, further comprising a transparent conductor layer formed over the nanostructured surface.

23. The semiconductor device of claim 17, wherein a junction between the doped layer and the silicon base region is planar.

* * * * *